United States Patent
Su et al.

(10) Patent No.: US 11,782,741 B2
(45) Date of Patent: Oct. 10, 2023

(54) MODELING OF FLUID INTRODUCTION AND/OR FLUID EXTRACTION ELEMENTS IN SIMULATION OF COREFLOOD EXPERIMENT

(71) Applicant: Schlumberger Technology Corporation, Sugar land, TX (US)

(72) Inventors: Shi Su, Maisons-Alfort (FR); Marie Ann Giddins, Oxon (GB); Paul Naccache, Oxon (GB); Andrew Clarke, Haslingfield (GB); Edmund J. Fordham, Fordham (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 230 days.

(21) Appl. No.: 16/803,899

(22) Filed: Feb. 27, 2020

(65) Prior Publication Data
US 2020/0201658 A1    Jun. 25, 2020

Related U.S. Application Data

(62) Division of application No. 15/548,764, filed as application No. PCT/US2016/016274 on Feb. 3, 2016, now abandoned.
(Continued)

(51) Int. Cl.
*G06F 9/455* (2018.01)
*E21B 43/16* (2006.01)
(Continued)

(52) U.S. Cl.
CPC .......... *G06F 9/455* (2013.01); *E21B 41/0092* (2013.01); *E21B 43/16* (2013.01);
(Continued)

(58) Field of Classification Search
CPC ...... G06F 9/455; E21B 41/0092; E21B 43/16; E21B 43/20; E21B 49/005
(Continued)

(56) References Cited

U.S. PATENT DOCUMENTS

| 4,206,809 A | * | 6/1980 | Jones | .................. E21B 43/20 166/400 |
|---|---|---|---|---|
| 4,278,128 A | | 7/1981 | Satter et al. | |

(Continued)

FOREIGN PATENT DOCUMENTS

| WO | 2014/168506 A1 | 10/2014 |
|---|---|---|
| WO | 2016/126759 A1 | 8/2016 |

(Continued)

OTHER PUBLICATIONS

Pandey et al. ("Chemical Flood Simulation of Laboratory Corefloods for the Mangala Field: Generating Parameters for Field-Scale Simulation", SPE 2008, pp. 1-11) (Year: 2008).*
(Continued)

*Primary Examiner* — Iftekhar A Khan
(74) *Attorney, Agent, or Firm* — Jeffrey D. Frantz

(57) ABSTRACT

A coreflood experiment may be modeled by generating a three dimensional computer simulation model of a core plug and modeling within the three dimensional computer simulation model one or both of a fluid introduction element or a fluid extraction element of a core holder used in the coreflood experiment. Once generated, the model may be loaded and used when running a simulation to model a heterogeneous distribution of fluid flow proximate one or more faces of the core plug.

20 Claims, 10 Drawing Sheets

Related U.S. Application Data

(60) Provisional application No. 62/111,158, filed on Feb. 3, 2015, provisional application No. 62/111,162, filed on Feb. 3, 2015, provisional application No. 62/111,166, filed on Feb. 3, 2015.

(51) Int. Cl.
    *G06F 30/20*     (2020.01)
    *E21B 49/00*     (2006.01)
    *E21B 41/00*     (2006.01)
    *E21B 43/20*     (2006.01)
    *C09K 8/584*     (2006.01)
    *C09K 8/588*     (2006.01)
    *E21B 47/12*     (2012.01)
    *E21B 49/02*     (2006.01)

(52) U.S. Cl.
    CPC ............ *E21B 43/20* (2013.01); *E21B 49/005* (2013.01); *G06F 30/20* (2020.01); *C09K 8/584* (2013.01); *C09K 8/588* (2013.01); *E21B 47/12* (2013.01); *E21B 49/00* (2013.01); *E21B 49/02* (2013.01)

(58) Field of Classification Search
    USPC .......................................................... 703/10
    See application file for complete search history.

(56) References Cited

U.S. PATENT DOCUMENTS

| | | | | |
|---|---|---|---|---|
| 4,817,423 | A * | 4/1989 | Christiansen | G01N 33/241 73/152.05 |
| 4,868,500 | A * | 9/1989 | Baldwin | G01R 33/30 324/318 |
| 5,105,894 | A * | 4/1992 | Enderlin | E21B 49/06 324/350 |
| 5,376,629 | A * | 12/1994 | Smith | C09K 8/36 507/901 |
| 5,480,106 | A * | 1/1996 | Voissem | B65H 75/24 242/613.5 |
| 7,788,037 | B2 | 8/2010 | Soliman et al. | |
| 7,925,481 | B2 * | 4/2011 | Van Wagoner | G01V 1/282 703/10 |
| 7,983,886 | B2 * | 7/2011 | Gullapalli | G06F 30/20 703/10 |
| 8,762,118 | B2 * | 6/2014 | Nasreldin | G01V 99/005 703/10 |
| 10,620,340 | B2 * | 4/2020 | Andersen | E21B 49/02 |
| 2003/0069143 | A1 * | 4/2003 | Collins | C09K 8/602 507/200 |
| 2004/0225441 | A1 * | 11/2004 | Tilke | G01V 1/44 702/6 |
| 2006/0047432 | A1 * | 3/2006 | Egermann | G01N 33/241 702/12 |
| 2006/0184346 | A1 * | 8/2006 | Panga | E21B 43/25 703/9 |
| 2006/0224369 | A1 | 10/2006 | Fang et al. | |
| 2008/0288226 | A1 * | 11/2008 | Gurpinar | E21B 43/00 703/10 |
| 2008/0319726 | A1 * | 12/2008 | Berge | E21B 41/0064 703/10 |
| 2009/0012765 | A1 * | 1/2009 | Raphael | E21B 43/16 703/10 |
| 2009/0020284 | A1 * | 1/2009 | Graf | E21B 44/00 166/250.15 |
| 2009/0070085 | A1 | 3/2009 | Gullapalli et al. | |
| 2009/0119082 | A1 * | 5/2009 | Fitzpatrick | G01V 11/00 703/10 |
| 2010/0006283 | A1 * | 1/2010 | Collins | C09K 8/58 166/261 |
| 2010/0181068 | A1 * | 7/2010 | Pope | C09K 8/584 166/270.1 |
| 2010/0250216 | A1 * | 9/2010 | Narr | E21B 49/00 703/10 |
| 2010/0270019 | A1 * | 10/2010 | Pope | E21B 47/10 166/305.1 |
| 2011/0082678 | A1 * | 4/2011 | Algive | G06F 30/23 703/12 |
| 2011/0100631 | A1 * | 5/2011 | Labeau | C09K 8/588 166/305.1 |
| 2011/0245937 | A1 | 10/2011 | Rawson et al. | |
| 2011/0290479 | A1 | 12/2011 | Izgec et al. | |
| 2011/0306525 | A1 * | 12/2011 | Lighthelm | C09K 8/58 507/225 |
| 2012/0018160 | A1 * | 1/2012 | Al-Yousef | E21B 43/20 166/305.1 |
| 2012/0125603 | A1 * | 5/2012 | Willingham | C09K 8/58 166/270.1 |
| 2012/0125604 | A1 * | 5/2012 | Willingham | C09K 8/58 166/270.1 |
| 2012/0125605 | A1 | 5/2012 | Willingham et al. | |
| 2012/0143579 | A1 * | 6/2012 | Collins | G05B 17/02 703/10 |
| 2012/0150519 | A1 * | 6/2012 | Bang | E21B 43/16 703/10 |
| 2012/0158380 | A1 * | 6/2012 | Hajibeygi | E21B 43/26 703/2 |
| 2012/0223235 | A1 * | 9/2012 | Maucec | G01N 15/0806 250/362 |
| 2012/0293180 | A1 * | 11/2012 | Chae | G01V 3/00 324/347 |
| 2013/0002258 | A1 * | 1/2013 | Ligneul | E21B 47/06 324/376 |
| 2013/0048279 | A1 * | 2/2013 | Appel | E21B 43/30 166/275 |
| 2013/0312958 | A1 | 2/2013 | Denyer et al. | |
| 2013/0125630 | A1 * | 5/2013 | Collins | G01N 1/00 73/64.56 |
| 2014/0076544 | A1 * | 3/2014 | Lecerf | E21B 33/138 175/50 |
| 2014/0151050 | A1 * | 6/2014 | Sanders | E21B 43/166 166/305.1 |
| 2014/0236557 | A1 | 8/2014 | Likanapaisal | |
| 2014/0290942 | A1 | 10/2014 | Brodie et al. | |
| 2015/0114636 | A1 | 4/2015 | Pereira-Almao et al. | |
| 2015/0233223 | A1 * | 8/2015 | AlAmeri | C09K 8/584 166/305.1 |
| 2016/0009981 | A1 * | 1/2016 | Teklu | C09K 8/594 166/305.1 |
| 2016/0063150 | A1 * | 3/2016 | Safonov | E21B 43/16 703/10 |
| 2016/0076369 | A1 * | 3/2016 | Ziauddin | E21B 43/25 703/2 |
| 2016/0109603 | A1 * | 4/2016 | Jin | G01N 29/225 73/152.58 |
| 2016/0160621 | A1 * | 6/2016 | Collins | C09K 8/58 166/275 |
| 2016/0194940 | A1 * | 7/2016 | Andersen | G06F 17/18 703/2 |
| 2016/0298426 | A1 | 10/2016 | Brodie et al. | |
| 2016/0306074 | A1 * | 10/2016 | Andersen | E21B 49/02 |
| 2017/0081583 | A1 * | 3/2017 | Han | C09K 8/584 |
| 2017/0158948 | A1 * | 6/2017 | Kim | C09K 8/882 |
| 2017/0234126 | A1 * | 8/2017 | Al-Shalabi | E21B 43/20 166/250.02 |
| 2017/0247992 | A1 * | 8/2017 | Parrella | E21B 36/04 |
| 2017/0248506 | A1 * | 8/2017 | Gupta | G01N 13/00 |
| 2017/0275970 | A1 * | 9/2017 | Crawford | E21B 43/26 |
| 2017/0362487 | A1 | 12/2017 | Waterman et al. | |

(56) References Cited

U.S. PATENT DOCUMENTS

| | | | |
|---|---|---|---|
| 2018/0023374 A1* | 1/2018 | Su | E21B 41/0092 |
| | | | 703/10 |
| 2018/0030819 A1 | 2/2018 | Su et al. | |
| 2018/0032356 A1 | 2/2018 | Su et al. | |

FOREIGN PATENT DOCUMENTS

| | | | | |
|---|---|---|---|---|
| WO | 2016/126761 A1 | 8/2016 | | |
| WO | WO-2016126759 A1 * | 8/2016 | ............ | E21B 41/00 |
| WO | WO-2016126762 A1 * | 8/2016 | ............ | E21B 41/00 |

OTHER PUBLICATIONS

Hiroshi Okabe ("Bridging Pore to Core-Scale Flow Properties Using Pore-Scale Modeling and Coreflood Simulation", International Symposium of the Society of Core Analysts, 2005, pp. 1-12) (Year: 2005).*

Bonder et al., "Mathematical Simulation of Polymer Flooding in Complex Reservoirs," SPE 3524, Society of Petroleum Engineers Journal, Oct. 1972, pp. 369-382.

Britt, et al., "Rotary Sidewall Cores—A Cost Effective Means of Determining Young's Modulus," SPE Annual Technical Conference and Exhibition held in Houston, TX, USA Sep. 26-29, 2004.

Element, et al., "New Coreflood Simulator Based on Independent Treatment of In-Situ Saturation and Pressure Data," SCA2002-07, 2002, pp. 1/12-12/12.

Gumpenberger, et al., "Polymer Viscosity in Porous Media and Near Wellbore Behaviour of A Polymer Pilot in The Matzen Field, Austria," OMC-2013-166, presented at the 11th Offshore Mediterranean Conference and Exhibition, 2013.

Kamaraj, et al., "Effect of Residual Oil Saturration on Recovery Efficiency during Polymer Flooding of Viscous Oils," Offshore Technology Conference, 2011, pp. 1-9.

Mitchell et al., "Quantitative Remaining Oil Interpretation Using Magnetic Resonance: From the Laboratory to the Pilot," SPE 154704, SPE EOR Conference at Oil and Gas West Asia held in Muscat, Oman, Apr. 16-18, 2012.

Mungan, "Shear Viscosities of Ionic Polyacrylamide Solutions," SPE 3521, Society of Petroleum Engineers Journal, 1972, pp. 469-473.

Pandey, et al., "Chemical Flood Simulation of Laboratory Corefloods for the Mangala Field: Generating Parameters for Field-Scale Simulation," Society of Petroleum Engineers, 2008, pp. 1-11, 2008.

Spearing, et al., "A Focused Relative Permeability Seal Study Driven by Reservoir Management Decisions," SCA2002-02, 2002, pp. 1/14-14/14.

Van Domselaar, "The Apparent Viscosity of Power-Law Fluids and Its Application in Polymer-Drive Simulations," SPE 10613, SPE Sixth International Symposium on Oilfield and Geothermal Chemistry, held in Dallas, Texas, Jan. 25-17, 1982, pp. 181-192.

Wassmuth, et al., "Polymer Flood Technology for Heavy Oil Recovery," 8th Canadian International Petroleum Conference, pp. .1-12, 2007.

International Search Report and Written Opinion for the International patent application PCT/US2016/016270 dated Apr. 26, 2016.

International Search Report and Written Opinion for the International patent application PCT/US2016/016273 dated Jun. 15, 2016.

International Search Report and Written Opinion for the International patent application PCT/US2016/016274 dated May 18, 2016.

International Preliminary Report on Patentability for the International patent application PCT/US2016/016270 dated Aug. 17, 2017.

International Preliminary Report on Patentability for the International patent application PCT/US2016/016273 dated Aug. 17, 2017.

International Preliminary Report on Patentability for the International patent application PCT/US2016/016274 dated Aug. 17, 2017.

Office Action for U.S. Appl. No. 15/548,762 dated Nov. 22, 2019.

Office Action for U.S. Appl. No. 15/548,763 dated Feb. 12, 2020.

Office Action for U.S. Appl. No. 15/548,762 dated Mar. 18, 2020.

Hirasaki, G. J. et al., "Analysis of Factors Influencing Mobility and Adsorption in the Flow of Polymer Solution Through Porous Media", Society of Petroleum Engineering Journal, 1974, pp. 337-346.

Office Action issued in U.S. Appl. No. 15/548,763 dated Jul. 12, 2021, 19 pages.

Exam Report received in GB Patent Application No. 1714166.4 dated Jul. 7, 2020, 3 pages.

Exam Report and notification of Intention to Grant received in GB Patent Application No. 1714161.5 dated Jul. 9, 2020, 2 pages.

Exam Report received in GB Patent Application No. 1714159.9 dated Jul. 22, 2020, 1 page.

Exam Report issued in Canada Patent Application No. 2974829 dated Feb. 1, 2022, 4 pages.

Exam Report issued in Canada Patent Application No. 2974829 dated Dec. 7, 2022, 6 pages.

Exam Report issued in Canada Patent Application No. 2974977 dated Dec. 7, 2022, 8 pages.

Exam Report issued in Canada Patent Application No. 2974977 dated Feb. 1, 2022, 3 pages.

Exam Report issued in Canada Patent Application No. 2974979 dated Jan. 31, 2022, 3 pages.

* cited by examiner

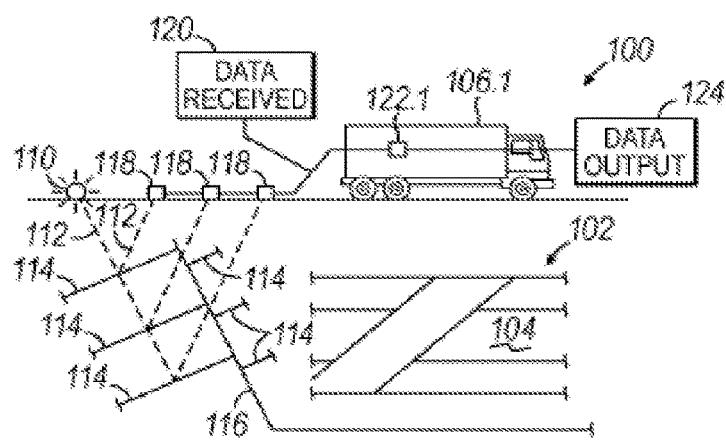 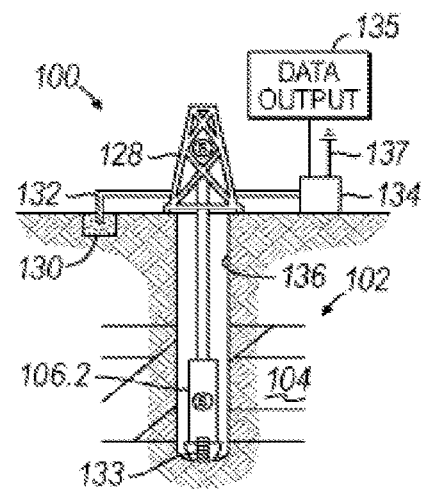
FIG. 2A  FIG. 2B
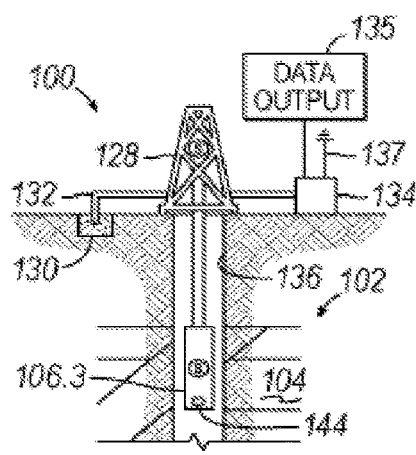 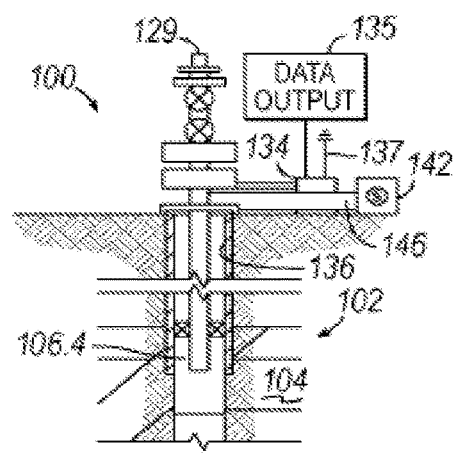
FIG. 2C  FIG. 2D

MODELING OF FLUID INTRODUCTION AND/OR FLUID EXTRACTION ELEMENTS IN SIMULATION OF COREFLOOD EXPERIMENT

BACKGROUND

Enhanced oil recovery (EOR) is aimed at increasing the recovery factor of oilfields by injecting agents such as chemicals, including viscoelastic polymers. The design of agent floods for field implementation can impact the success of such operations, both in terms of incremental oil recovery, and in net present value. Reservoir simulation may be used to assist in the design of such floods, and it has been found that the accuracy of the reservoir simulation can likewise impact both the design and the ultimate field implementation.

In addition, reservoir simulation models may be calibrated by using experimental data collected during coreflood experiments, during which core samples taken from an oilfield are flooded with various fluids to measure various flow parameters for the core. Doing so generally increases confidence in the experimental data and in simulation results.

SUMMARY

The embodiments disclosed herein provide in one aspect a method of modeling a coreflood experiment, which includes generating a three dimensional computer simulation model of a core plug used in a coreflood experiment and modeling in the three dimensional computer simulation model of the core plug one or both of a fluid introduction element or a fluid extraction element of a core holder used in the coreflood experiment.

In some embodiments, the core plug is homogeneous such that the three dimensional computer simulation model has a plurality of grid cells having a same property, while in some embodiments, the core plug is heterogeneous such that the three dimensional computer simulation model has a plurality of grid cells with varying properties. Some embodiments also include running a simulation using the three dimensional computer simulation model in a computer-implemented reservoir simulator to model distribution and fingering of fluid flow proximate one or more faces of the core plug, and in some embodiments, running the simulation includes modeling pressure drop across the core plug.

In some embodiments, the computer-implemented reservoir simulator includes a general purpose reservoir simulator, generating the three dimensional computer simulation model is performed using a graphical pre/post-processor for the general purpose reservoir simulator, and the method further includes displaying simulation results in three dimensions using the graphical pre/post-processor. Also, in some embodiments, the one or both of the fluid introduction element or the fluid extraction element modeled in the three dimensional computer simulation model an end effect in the coreflood experiment, and running the simulation includes modeling boundary conditions by representing the fluid introduction element as an injection well and representing the fluid extraction element as a production well. Moreover, in some embodiments, modeling one or both of the fluid introduction element or the fluid extraction element includes modeling the fluid introduction element and the fluid extraction element, and in some embodiments, modeling the fluid introduction element and the fluid extraction element includes modeling a plurality of ports in each of the fluid introduction element and the fluid extraction element. In some embodiments, modeling the fluid introduction element and the fluid extraction element includes modeling a plurality of channels in each of the fluid introduction element and the fluid extraction element. In some embodiments, the modeled channels include circular channels and/or radial channels.

Further, in some embodiments, the three dimensional computer simulation model has a grid with a resolution that substantially matches that of a nuclear magnetic resonance scanner used to determine oil saturation in the core during the coreflood experiment, and in some embodiments, the one or both of the fluid introduction element or the fluid extraction element are symmetrical about one or more planes along an axis of symmetry of the core plug, and generating the three dimensional computer simulation model and modeling one or both of the fluid introduction element or the fluid extraction element includes modeling only a segment of the core plug and the one or both of the fluid introduction element or the fluid extraction element. In some such embodiments, the fluid introduction element and the fluid extraction element are each symmetrical about a single plane, and generating the three dimensional computer simulation model and modeling one or both of the fluid introduction element or the fluid extraction element include modeling only a semi cylinder segment of the core plug and the one or both of the fluid introduction element or the fluid extraction element. In addition, in some such embodiments, the fluid introduction element and the fluid extraction element are each symmetrical about a first and second orthogonal planes, and generating the three dimensional computer simulation model and modeling one or both of the fluid introduction element or the fluid extraction element include modeling only a quarter cylinder segment of the core plug and the one or both of the fluid introduction element or the fluid extraction element.

The embodiments disclosed herein may also provide in another aspect a method of modeling fluid flow through a core plug in a coreflood experiment, which includes loading a three dimensional computer simulation model of a core plug that additionally models one or both of a fluid introduction element or a fluid extraction element of a core holder and running a simulation using the three dimensional computer simulation model in a computer-implemented reservoir simulator to model heterogeneous distribution of fluid flow proximate one or more faces of the core plug.

Other embodiments may include an apparatus including a memory, at least one processing unit, and program code configured upon execution by the at least one processing unit to perform any of the above-described operations. Still other embodiments may include a program product including a non-transitory computer readable medium and program code stored on the computer readable medium and configured upon execution by at least one processing unit to perform any of the above-described operations.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

BRIEF DESCRIPTION OF THE DRAWINGS

FIGS. 2A-2D illustrate simplified, schematic views of an oilfield having subterranean formations containing reservoirs therein in accordance with implementations of various technologies and techniques described herein.

DETAILED DESCRIPTION

Figure 1:
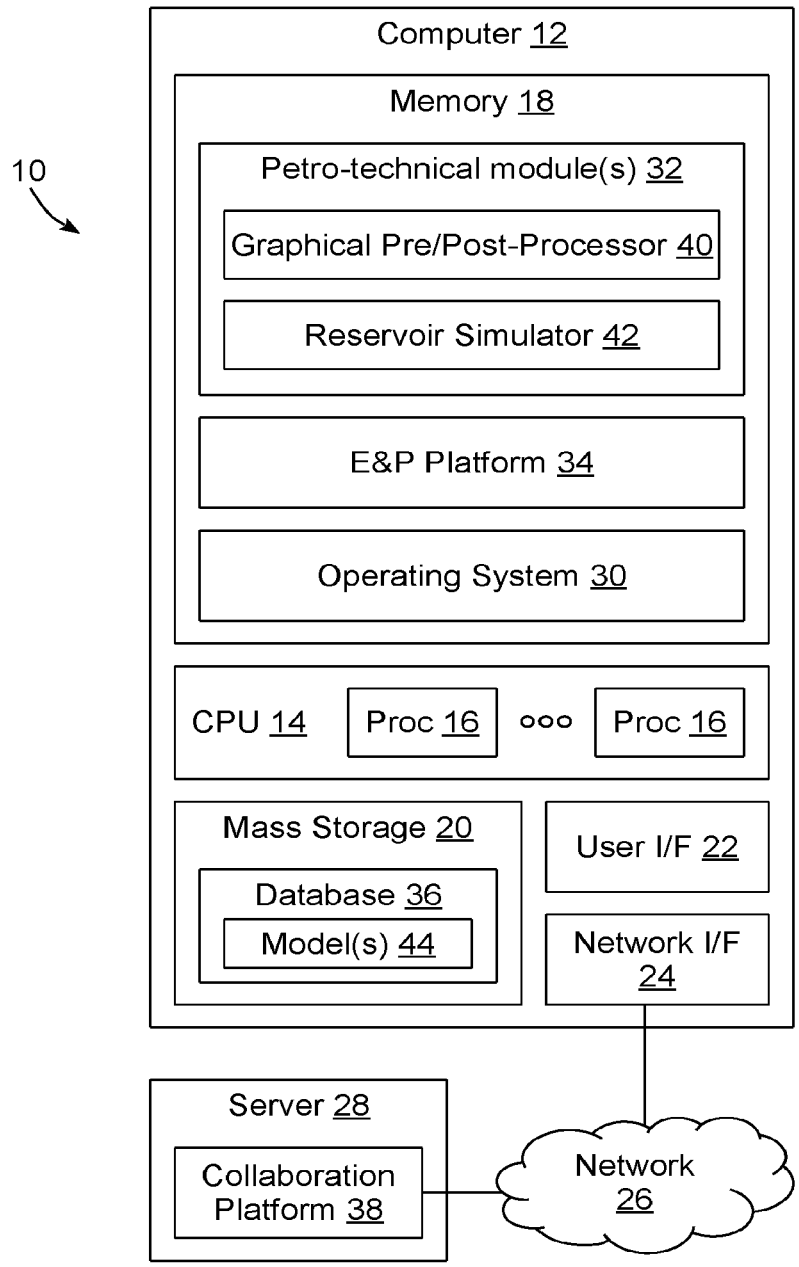
FIG. 1 is a block diagram of an example hardware and software environment for a data processing system in accordance with implementation of various technologies and techniques described herein.

Turning now to the drawings, wherein like numbers denote like parts throughout the several views, FIG. 1 illustrates an example data processing system 10 in which the various technologies and techniques described herein may be implemented. System 10 is illustrated as including one or more computers 12, e.g., client computers, each including a central processing unit (CPU) 14 including at least one hardware-based processor or processing core 16. CPU 14 is coupled to a memory 18, which may represent the random access memory (RAM) devices comprising the main storage of a computer 12, as well as any supplemental levels of memory, e.g., cache memories, non-volatile or backup memories (e.g., programmable or flash memories), read-only memories, etc. In addition, memory 18 may be considered to include memory storage physically located elsewhere in a computer 12, e.g., any cache memory in a microprocessor or processing core, as well as any storage capacity used as a virtual memory, e.g., as stored on a mass storage device 20 or on another computer coupled to a computer 12.

Each computer 12 also generally receives a number of inputs and outputs for communicating information externally. For interface with a user or operator, a computer 12 generally includes a user interface 22 incorporating one or more user input/output devices, e.g., a keyboard, a pointing device, a display, a printer, etc. Otherwise, user input may be received, e.g., over a network interface 24 coupled to a network 26, from one or more external computers, e.g., one or more servers 28 or other computers 12. A computer 12 also may be in communication with one or more mass storage devices 20, which may be, for example, internal hard disk storage devices, external hard disk storage devices, storage area network devices, etc.

A computer 12 generally operates under the control of an operating system 30 and executes or otherwise relies upon various computer software applications, components, programs, objects, modules, data structures, etc. For example, one or more petro-technical modules or components 32 executing within an exploration and production (E&P) platform 34 may be used to access, process, generate, modify or otherwise utilize petro-technical data, e.g., as stored locally in a database 36 and/or accessible remotely from a collaboration platform 38. Collaboration platform 38 may be implemented using multiple servers 28 in some implementations, and it will be appreciated that each server 28 may incorporate a CPU, memory, and other hardware components similar to a computer 12. In some embodiments, portions of data processing system 10 may be implemented within a cloud computing environment.

In one non-limiting embodiment, for example, the one or more petro-technical modules 32 may include a graphical pre/post-processor 40 such as the PETREL graphical pre/post-processor and a general purpose reservoir simulator 42 such as the ECLIPSE reservoir simulator, E&P platform 34 may implemented as the PETREL Exploration & Production (E&P) software platform, while collaboration platform 38 may be implemented as the STUDIO E&P KNOWLEDGE ENVIRONMENT platform, all of which are available from Schlumberger Ltd. and its affiliates. It will be appreciated, however, that the techniques discussed herein may be utilized in connection with other platforms and environments, so the invention is not limited to the particular software platforms and environments discussed herein. For example, any of the aforementioned components may be run on a server, on a desktop device, on a mobile device, in a cloud computing environment, as a remote desktop or in a virtual machine, etc.

In general, the routines executed to implement the embodiments disclosed herein, whether implemented as part of an operating system or a specific application, component, program, object, module or sequence of instructions, or even a subset thereof, will be referred to herein as "computer program code," or simply "program code." Program code generally comprises one or more instructions that are resident at various times in various memory and storage devices in a computer, and that, when read and executed by one or more hardware-based processing units in a computer (e.g., microprocessors, processing cores, or other hardware-based circuit logic), cause that computer to perform the steps embodying desired functionality. Moreover, while embodiments have and hereinafter will be described in the context of fully functioning computers and computer systems, those skilled in the art will appreciate that the various embodiments are capable of being distributed as a program product in a variety of forms, and that the invention applies equally regardless of the particular type of computer readable media used to actually carry out the distribution.

Such computer readable media may include computer readable storage media and communication media. Computer readable storage media is non-transitory in nature, and may include volatile and non-volatile, and removable and non-removable media implemented in any method or technology for storage of information, such as computer-readable instructions, data structures, program modules or other data. Computer readable storage media may further include RAM, ROM, erasable programmable read-only memory (EPROM), electrically erasable programmable read-only memory (EEPROM), flash memory or other solid state memory technology, CD-ROM, DVD, or other optical storage, magnetic cassettes, magnetic tape, magnetic disk storage or other magnetic storage devices, or any other medium that can be used to store the desired information and which can be accessed by computer 10. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

Various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Furthermore, it will be appreciated by those of ordinary skill in the art having the benefit of the instant disclosure that the various operations described herein that may be performed by any program code, or performed in any routines, workflows, or the like, may be combined, split, reordered, omitted, and/or supplemented with other techniques known in the art, and therefore, the invention is not limited to the particular sequences of operations described herein.

Those skilled in the art will recognize that the example environment illustrated in FIG. 1 is not intended to limit the invention. Indeed, those skilled in the art will recognize that other alternative hardware and/or software environments may be used without departing from the scope of the invention.

Oilfield Operations

FIGS. 2A-2D illustrate simplified, schematic views of an oilfield 100 having subterranean formation 102 containing reservoir 104 therein in accordance with implementations of various technologies and techniques described herein. FIG. 2A illustrates a survey operation being performed by a survey tool, such as seismic truck 106.1, to measure properties of the subterranean formation. The survey operation is a seismic survey operation for producing sound vibrations. In FIG. 2A, one such sound vibration, sound vibration 112 generated by source 110, reflects off horizons 114 in earth formation 116. A set of sound vibrations is received by sensors, such as geophone-receivers 118, situated on the earth's surface. The data received 120 is provided as input data to a computer 122.1 of a seismic truck 106.1, and responsive to the input data, computer 122.1 generates seismic data output 124. This seismic data output may be stored, transmitted or further processed as desired, for example, by data reduction.

FIG. 2B illustrates a drilling operation being performed by drilling tools 106.2 suspended by rig 128 and advanced into subterranean formations 102 to form wellbore 136. Mud pit 130 is used to draw drilling mud into the drilling tools via flow line 132 for circulating drilling mud down through the drilling tools, then up wellbore 136 and back to the surface. The drilling mud may be filtered and returned to the mud pit. A circulating system may be used for storing, controlling, or filtering the flowing drilling muds. The drilling tools are advanced into subterranean formations 102 to reach reservoir 104. Each well may target one or more reservoirs. The drilling tools are adapted for measuring downhole properties using logging while drilling tools. The logging while drilling tools may also be adapted for taking core sample 133 as shown.

Computer facilities may be positioned at various locations about the oilfield 100 (e.g., the surface unit 134) and/or at remote locations. Surface unit 134 may be used to communicate with the drilling tools and/or offsite operations, as well as with other surface or downhole sensors. Surface unit 134 is capable of communicating with the drilling tools to send commands to the drilling tools, and to receive data therefrom. Surface unit 134 may also collect data generated during the drilling operation and produces data output 135, which may then be stored or transmitted.

Sensors (S), such as gauges, may be positioned about oilfield 100 to collect data relating to various oilfield operations as described previously. As shown, sensor (S) is positioned in one or more locations in the drilling tools and/or at rig 128 to measure drilling parameters, such as weight on bit, torque on bit, pressures, temperatures, flow rates, compositions, rotary speed, and/or other parameters of the field operation. Sensors (S) may also be positioned in one or more locations in the circulating system.

Drilling tools 106.2 may include a bottom hole assembly (BHA) (not shown), generally referenced, near the drill bit (e.g., within several drill collar lengths from the drill bit). The bottom hole assembly includes capabilities for measuring, processing, and storing information, as well as communicating with surface unit 134. The bottom hole assembly further includes drill collars for performing various other measurement functions.

The bottom hole assembly may include a communication subassembly that communicates with surface unit 134. The communication subassembly is adapted to send signals to and receive signals from the surface using a communications channel such as mud pulse telemetry, electro-magnetic telemetry, or wired drill pipe communications. The communication subassembly may include, for example, a transmitter that generates a signal, such as an acoustic or electromagnetic signal, which is representative of the measured drilling parameters. It will be appreciated by one of skill in the art that a variety of telemetry systems may be employed, such as wired drill pipe, electromagnetic or other known telemetry systems.

Generally, the wellbore is drilled according to a drilling plan that is established prior to drilling. The drilling plan sets forth equipment, pressures, trajectories and/or other parameters that define the drilling process for the wellsite. The drilling operation may then be performed according to the drilling plan. However, as information is gathered, the drilling operation may need to deviate from the drilling plan. Additionally, as drilling or other operations are performed, the subsurface conditions may change. The earth model may also need adjustment as new information is collected The data gathered by sensors (S) may be collected by surface unit 134 and/or other data collection sources for analysis or other processing. The data collected by sensors (S) may be used alone or in combination with other data. The data may be collected in one or more databases and/or transmitted on or offsite. The data may be historical data, real time data, or combinations thereof. The real time data may be used in real time, or stored for later use. The data may also be combined with historical data or other inputs for further analysis. The data may be stored in separate databases, or combined into a single database.

Surface unit 134 may include transceiver 137 to allow communications between surface unit 134 and various portions of the oilfield 100 or other locations. Surface unit 134 may also be provided with or functionally connected to one or more controllers (not shown) for actuating mechanisms at oilfield 100. Surface unit 134 may then send command signals to oilfield 100 in response to data received. Surface unit 134 may receive commands via transceiver 137 or may itself execute commands to the controller. A processor may be provided to analyze the data (locally or remotely), make the decisions and/or actuate the controller. In this manner, oilfield 100 may be selectively adjusted based on the data collected. This technique may be used to optimize portions of the field operation, such as controlling drilling, weight on bit, pump rates, or other parameters. These adjustments may be made automatically based on computer protocol, and/or manually by an operator. In some cases, well plans may be adjusted to select optimum operating conditions, or to avoid problems.

FIG. 2C illustrates a wireline operation being performed by wireline tool 106.3 suspended by rig 128 and into wellbore 136 of FIG. 2B. Wireline tool 106.3 is adapted for deployment into wellbore 136 for generating well logs, performing downhole tests and/or collecting samples. Wireline tool 106.3 may be used to provide another method and apparatus for performing a seismic survey operation. Wireline tool 106.3 may, for example, have an explosive, radioactive, electrical, or acoustic energy source 144 that sends and/or receives electrical signals to surrounding subterranean formations 102 and fluids therein.

Wireline tool 106.3 may be operatively connected to, for example, geophones 118 and a computer 122.1 of a seismic truck 106.1 of FIG. 2A. Wireline tool 106.3 may also provide data to surface unit 134. Surface unit 134 may collect data generated during the wireline operation and may produce data output 135 that may be stored or transmitted. Wireline tool 106.3 may be positioned at various depths in the wellbore 136 to provide a survey or other information relating to the subterranean formation 102.

Sensors (S), such as gauges, may be positioned about oilfield 100 to collect data relating to various field operations as described previously. As shown, sensor S is positioned in wireline tool 106.3 to measure downhole parameters which relate to, for example porosity, permeability, fluid composition and/or other parameters of the field operation.

FIG. 2D illustrates a production operation being performed by production tool 106.4 deployed from a production unit or Christmas tree 129 and into completed wellbore 136 for drawing fluid from the downhole reservoirs into surface facilities 142. The fluid flows from reservoir 104 through perforations in the casing (not shown) and into production tool 106.4 in wellbore 136 and to surface facilities 142 via gathering network 146.

Sensors (S), such as gauges, may be positioned about oilfield 100 to collect data relating to various field operations as described previously. As shown, the sensor (S) may be positioned in production tool 106.4 or associated equipment, such as christmas tree 129, gathering network 146, surface facility 142, and/or the production facility, to measure fluid parameters, such as fluid composition, flow rates, pressures, temperatures, and/or other parameters of the production operation.

Production may also include injection wells for added recovery. One or more gathering facilities may be operatively connected to one or more of the wellsites for selectively collecting downhole fluids from the wellsite(s).

While FIGS. 2B-2D illustrate tools used to measure properties of an oilfield, it will be appreciated that the tools may be used in connection with non-oilfield operations, such as gas fields, mines, aquifers, storage, or other subterranean facilities. Also, while certain data acquisition tools are depicted, it will be appreciated that various measurement tools capable of sensing parameters, such as seismic two-way travel time, density, resistivity, production rate, etc., of the subterranean formation and/or its geological formations may be used. Various sensors (S) may be located at various positions along the wellbore and/or the monitoring tools to collect and/or monitor the desired data. Other sources of data may also be provided from offsite locations.

The field configurations of FIGS. 2A-2D are intended to provide a brief description of an example of a field usable with oilfield application frameworks. Part, or all, of oilfield 100 may be on land, water, and/or sea. Also, while a single field measured at a single location is depicted, oilfield applications may be utilized with any combination of one or more oilfields, one or more processing facilities and one or more wellsites.

Figure 3:
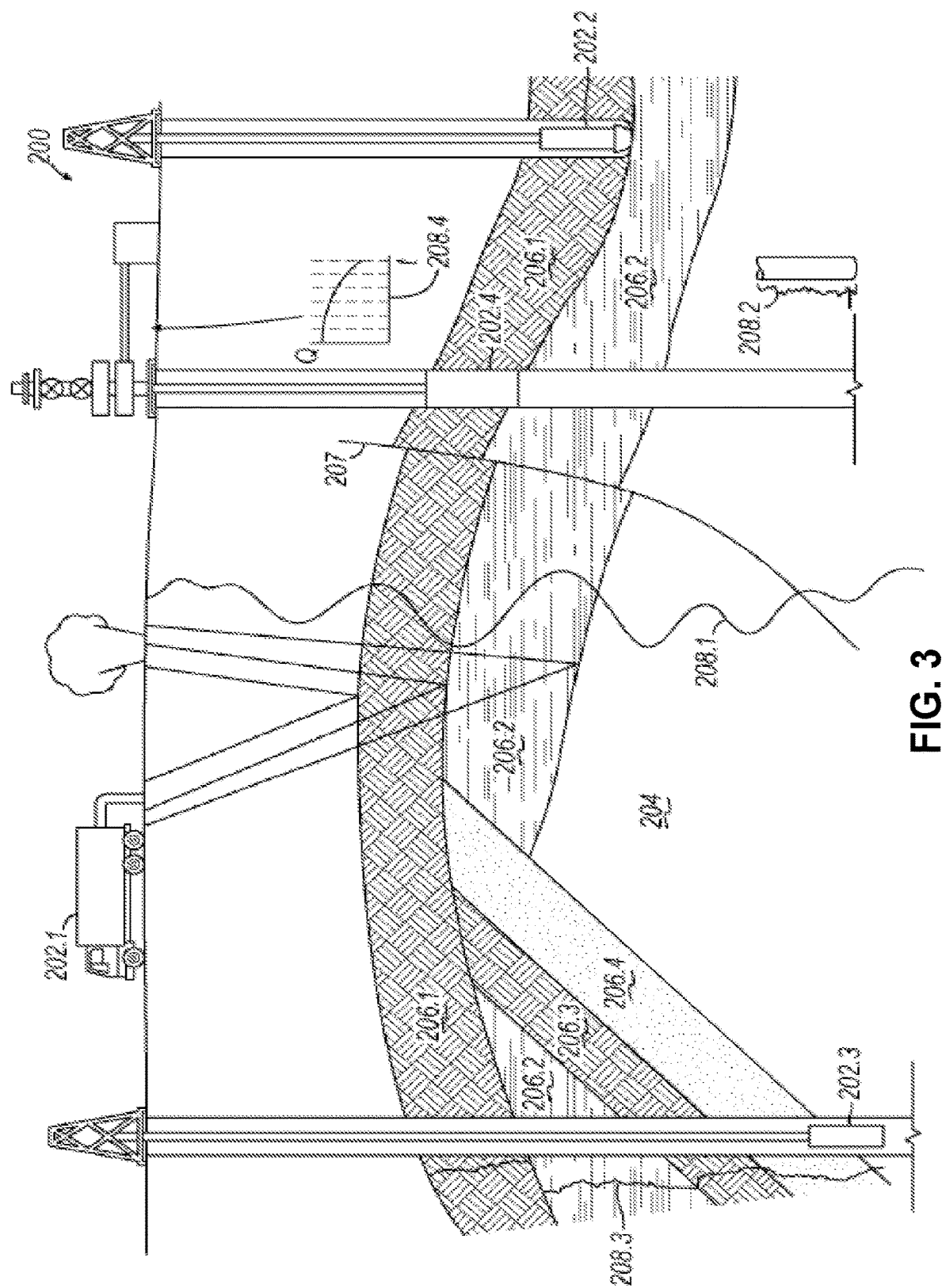
FIG. 3 illustrates a schematic view, partially in cross section of an oilfield having a plurality of data acquisition tools positioned at various locations along the oilfield for collecting data from the subterranean formations in accordance with implementations of various technologies and techniques described herein.

FIG. 3 illustrates a schematic view, partially in cross section of oilfield 200 having data acquisition tools 202.1, 202.2, 202.3 and 202.4 positioned at various locations along oilfield 200 for collecting data of subterranean formation 204 in accordance with implementations of various technologies and techniques described herein. Data acquisition tools 202.1-202.4 may be the same as data acquisition tools 106.1-106.4 of FIGS. 2A-2D, respectively, or others not depicted. As shown, data acquisition tools 202.1-202.4 generate data plots or measurements 208.1-208.4, respectively. These data plots are depicted along oilfield 200 to demonstrate the data generated by the various operations.

Data plots 208.1-208.3 are examples of static data plots that may be generated by data acquisition tools 202.1-202.3, respectively, however, it should be understood that data plots 208.1-208.3 may also be data plots that are updated in real time. These measurements may be analyzed to better define the properties of the formation(s) and/or determine the accuracy of the measurements and/or for checking for errors. The plots of each of the respective measurements may be aligned and scaled for comparison and verification of the properties.

Static data plot 208.1 is a seismic two-way response over a period of time. Static plot 208.2 is core sample data measured from a core sample of the formation 204. The core sample may be used to provide data, such as a graph of the density, porosity, permeability, or some other physical property of the core sample over the length of the core. Tests for density and viscosity may be performed on the fluids in the core at varying pressures and temperatures. Static data plot 208.3 is a logging trace that generally provides a resistivity or other measurement of the formation at various depths.

A production decline curve or graph 208.4 is a dynamic data plot of the fluid flow rate over time. The production decline curve generally provides the production rate as a function of time. As the fluid flows through the wellbore, measurements are taken of fluid properties, such as flow rates, pressures, composition, etc.

Other data may also be collected, such as historical data, user inputs, economic information, and/or other measurement data and other parameters of interest. As described below, the static and dynamic measurements may be analyzed and used to generate models of the subterranean formation to determine characteristics thereof. Similar measurements may also be used to measure changes in formation aspects over time.

The subterranean structure 204 has a plurality of geological formations 206.1-206.4. As shown, this structure has several formations or layers, including a shale layer 206.1, a carbonate layer 206.2, a shale layer 206.3 and a sand layer 206.4. A fault 207 extends through the shale layer 206.1 and the carbonate layer 206.2. The static data acquisition tools are adapted to take measurements and detect characteristics of the formations.

While a specific subterranean formation with specific geological structures is depicted, it will be appreciated that oilfield 200 may contain a variety of geological structures and/or formations, sometimes having extreme complexity. In some locations, generally below the water line, fluid may occupy pore spaces of the formations. Each of the measurement devices may be used to measure properties of the formations and/or its geological features. While each acquisition tool is shown as being in specific locations in oilfield 200, it will be appreciated that one or more types of measurement may be taken at one or more locations across one or more fields or other locations for comparison and/or analysis.

The data collected from various sources, such as the data acquisition tools of FIG. 3, may then be processed and/or evaluated. Generally, seismic data displayed in static data plot 208.1 from data acquisition tool 202.1 is used by a geophysicist to determine characteristics of the subterranean formations and features. The core data shown in static plot 208.2 and/or log data from well log 208.3 are generally used by a geologist to determine various characteristics of the subterranean formation. The production data from graph 208.4 is generally used by the reservoir engineer to determine fluid flow reservoir characteristics. The data analyzed by the geologist, geophysicist and the reservoir engineer may be analyzed using modeling techniques.

Figure 4:
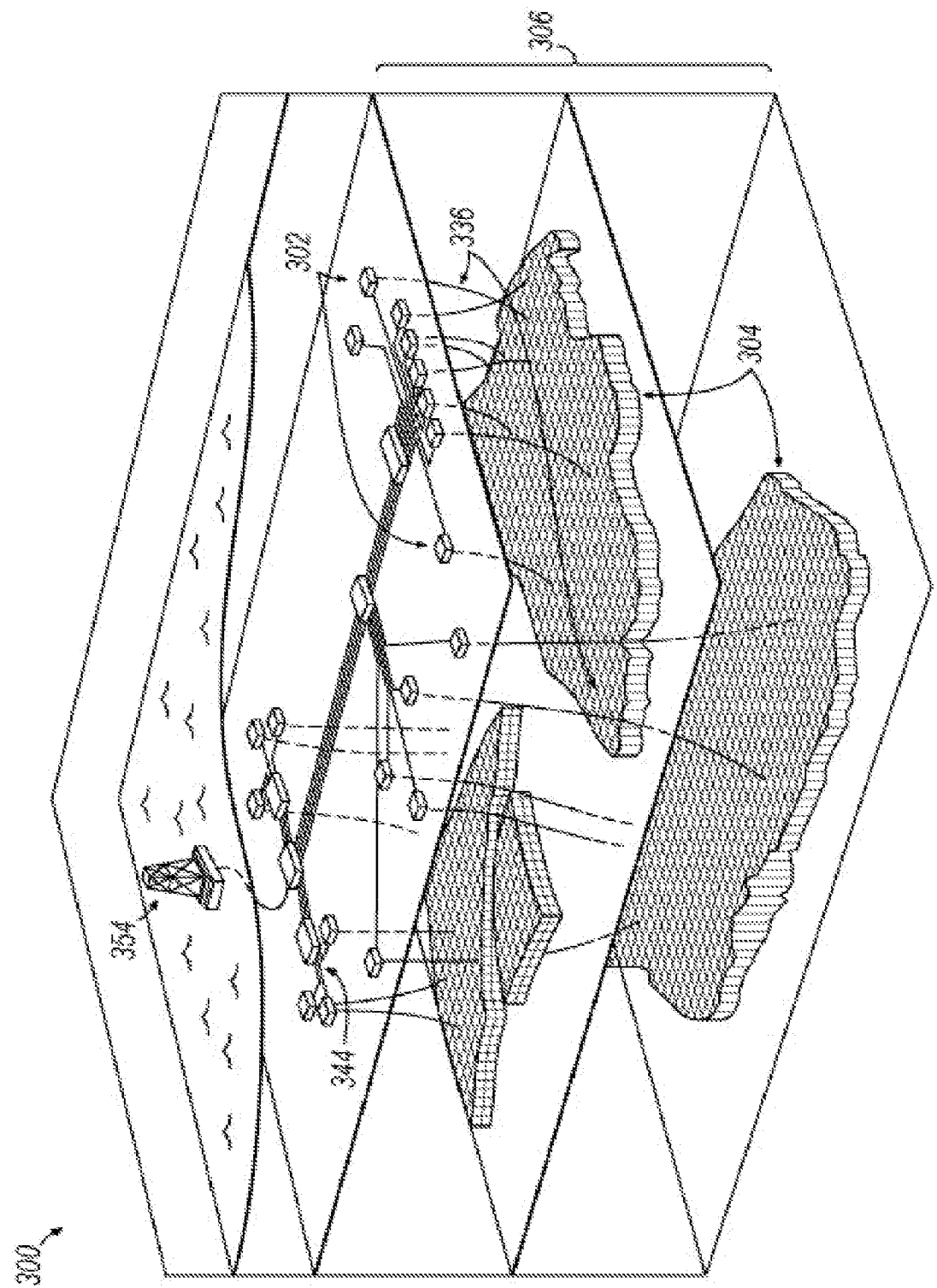
FIG. 4 illustrates a production system for performing one or more oilfield operations in accordance with implementations of various technologies and techniques described herein.

FIG. 4 illustrates an oilfield 300 for performing production operations in accordance with implementations of various technologies and techniques described herein. As shown, the oilfield has a plurality of wellsites 302 operatively connected to central processing facility 354. The oilfield configuration of FIG. 4 is not intended to limit the scope of the oilfield application system. Part or all of the oilfield may be on land and/or sea. Also, while a single oilfield with a single processing facility and a plurality of wellsites is depicted, any combination of one or more oilfields, one or more processing facilities and one or more wellsites may be present.

Each wellsite 302 has equipment that forms wellbore 336 into the earth. The wellbores extend through subterranean formations 306 including reservoirs 304. These reservoirs 304 contain fluids, such as hydrocarbons. The wellsites draw fluid from the reservoirs and pass them to the processing facilities via surface networks 344. The surface networks 344 have tubing and control mechanisms for controlling the flow of fluids from the wellsite to processing facility 354.

EOR Chemical Coreflood Simulation Study Workflow

Chemical EOR processes, such as surfactant or polymer flooding (among others), are used in the oil and gas industry to improve the recovery of hydrocarbons. In order to design these processes, laboratory experiments such as coreflood experiments, may be used. Coreflood experiments, however, generally look at very small scales, e.g., using cores (also referred to herein as core plugs) that are at most several centimeters in diameter and length, and experiments on cores are generally time-consuming. Pilot studies may also be used to design these processes; however implementing such pilot studies can be very expensive and collecting results can take a substantial amount of time. Reservoir simulation offers the potential for being cheaper and faster, thereby potentially facilitating the EOR design process.

In this regard, EOR chemical flooding, or coreflooding, generally refers to the injection of a chemical composition including one or more chemical agents suitable for use in connection with enhanced oil recovery. Such compositions may include, in some embodiments, one of more chemical structures each with one or more molecular weights that together with zero, one or more subsidiary components such as salts, pH adjusters or surfactants form an aqueous solution. In the embodiments discussed below, for example, the focus is on polymer flooding using aqueous polymer solutions incorporating one or more polymers along with any of the aforementioned subsidiary components. Any references herein to polymers therefore may be considered to refer to various aqueous polymer compositions. It will appreciated, however, that other EOR chemical floods, using other EOR chemicals (including, for example, formation water, low salinity water, surfactant, alkali, polymer gel, foam, nanoparticles, other chemical additives, some combination of two or more of the aforementioned EOR agents, etc.) may be used in other embodiments, so the invention is not limited specifically to polymer flooding.

Embodiments consistent with the invention may be used to model in a reservoir simulator the results of an EOR chemical coreflood experiment and thereby generate a coreflood simulation model. As such, a general purpose reservoir simulator conventionally used for modeling an oilfield, e.g., the ECLIPSE reservoir simulator available from Schlumberger Ltd. and its affiliates, among others, may be used to model an EOR chemical coreflood experiment. In this regard, the term "general purpose reservoir simulator" is used to refer to a reservoir simulator that is used for modeling an oilfield, as opposed to a special purpose simulator built specifically to model a core or a coreflood experiment.

Moreover, in the embodiments discussed hereinafter, the term "core" or "core plug" may be used to refer to rock core samples extracted from a wellbore, as well as other bodies upon which a coreflood experiment may be performed, including, for example, reconstituted cores, sandpacks, bead packs, etc. Further, while the embodiments discussed hereinafter may refer to water floods, it will be appreciated that the term "water" may be used to refer to other types of aqueous solutions including different brine formulations.

An example workflow is disclosed herein, in particular, to demonstrate the feasibility of an EOR chemical coreflood simulation study using the ECLIPSE reservoir simulator. The invention, however, may be utilized in connection with other reservoir simulators, so the invention is not limited to use solely with the ECLIPSE reservoir simulator as used herein. It will be appreciated that the workflow may be implemented solely within a computer environment and with the use of one or more processors in some embodiments, whereas in other embodiments, some acts or operations in the work flow may be performed by a user outside of the computer environment, with other acts or operations performed with the use of one or more processors.

Figure 5:
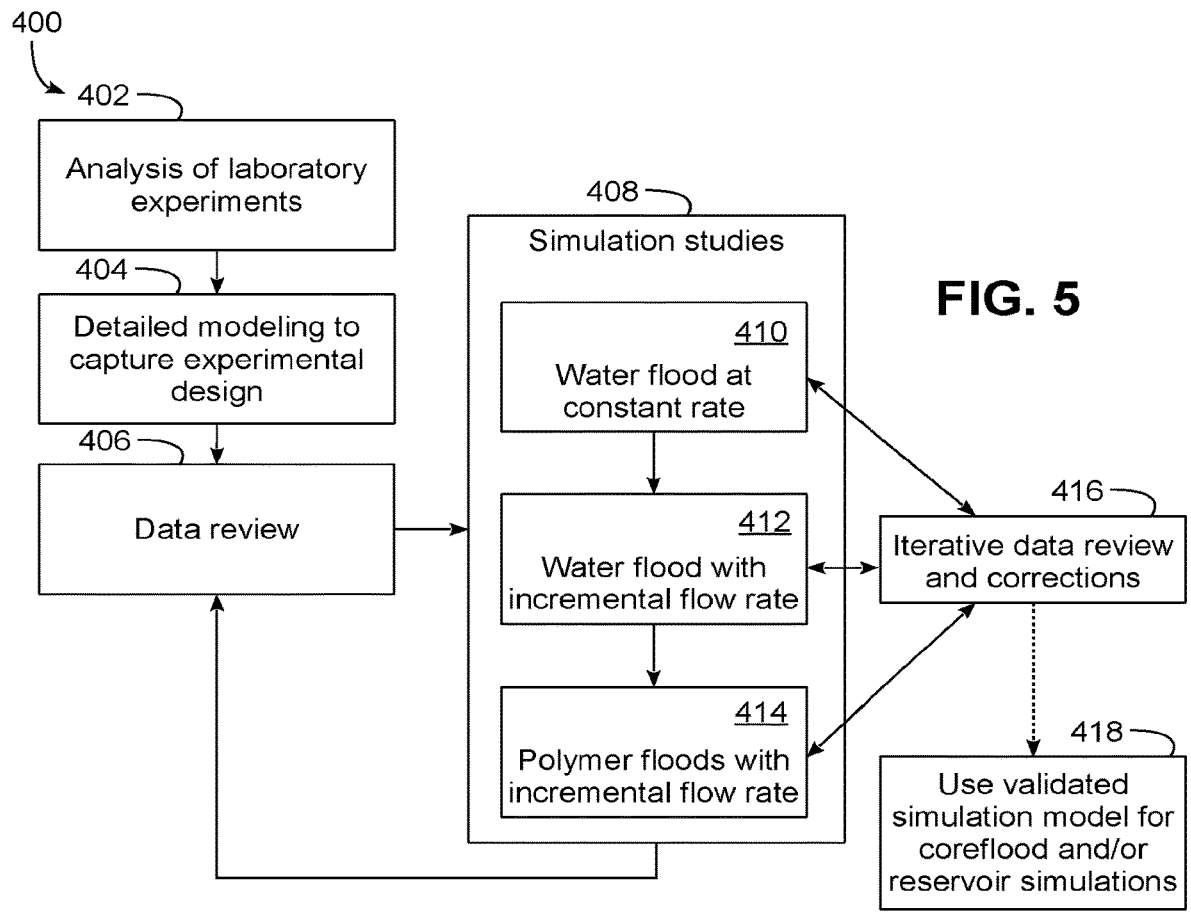
FIG. 5 illustrates an example workflow in accordance with implementations of various technologies and techniques described herein.

FIG. 5 illustrates an example workflow 400, which may be performed to process the results of an EOR chemical coreflood experiment, and in particular, a polymer coreflood experiment, and thereby conduct a polymer coreflood simulation study for enhanced oil recovery through reservoir simulation for a viscoelastic polymer. As will be appreciated, viscoelastic polymers may be injected into a reservoir along with water or another fluid to form an aqueous polymer composition and thereby increase the overall viscosity of the injected composition, among other reasons, and one goal of an EOR chemical coreflood simulation study is to attempt to predict an increase in production as a result of a field implementation of an EOR operation.

Workflow 400 may begin as illustrated in block 402 by performing analysis of the lab experiments. For example, the experimental apparatus and experimental protocol used for the experiments may be analyzed, as may how the data was measured and the precision to which the data was measured in the experiments. Doing so enables suitable reservoir simulator parameters to be determined prior to building a simulation model.

In some embodiments, for example, an experiment may be performed on a core sample of substantially homogeneous material within a core holder that includes fluid introduction and extraction elements referred to as platens that allow fluids to circulate through the core, and that are designed to distribute the entry and exit of fluids in the core across a large area of the faces of the core.

In one non-limiting example experiment, the core may be filled with oil, e.g., at a rate of about 10 cm$^3$/min during 20 PV, until the core is substantially saturated with oil (e.g., about 96%). An initial water (brine) flood may then be performed at a constant rate, e.g., at about 0.2 cm$^3$/min during 20 PV, during which a relatively large initial residual oil saturation (e.g., about 64%) may be reached. Then, another water (brine) flood may be performed at incremental or stepwise increasing flow rates, e.g., ranging from about 0.01 cm$^3$/min to about 100 cm$^3$/min. Subsequently, a polymer flood (e.g., with an aqueous polymer composition comprising an anionic polysaccharide such as Xanthan and a partially hydrolyzed polyacrylamide (HPAM) synthetic polyanion), may also be performed at incremental or stepwise increasing flow rates, e.g., ranging from about 0.01 cm$^3$/min to about 100 cm$^3$/min. Thereafter, the core may be flushed with water or brine at about 0.01 cm$^3$/min during 30 PV to flush out any polymer remaining within the core and enable the experiment to be repeated for other aqueous polymer compositions. During each flood, measurements may be made of both pressure (e.g., at the entrance and outlet to derive a pressure drop across the core) and oil saturation (e.g., using nuclear magnetic resonance (NMR) measurements in the middle-third of the core to minimize end-effects introduced by the platens).

Next, in block 404, detailed modeling may be performed to create a three-dimensional (3D) simulation model in the reservoir simulator capturing the design of the experiment. In particular, a 3D simulation model of the core sample may be created, mirroring the geometry of the core sample and partitioned into a three dimensional grid of cells. In some embodiments, the core sample may be treated as a homogeneous material, such that all of the grid cells associated with the core sample are assigned the same property values such as porosity and permeability. In addition, in some embodiments, and as will be described in greater detail below, additional aspects of the experimental apparatus, e.g., the core holder platens, may also be incorporated into the simulation model to more effectively model end effects. In other embodiments, however, a core sample may be treated as a heterogeneous material, with some or all of the grid cells associated with the core sample having varying property values.

Next, in block 406, the data may be reviewed, e.g., by performing data quality analysis and quality control to identify uncertainty on the data, and potential errors in the data due to calibration of measurement devices or other sources of inaccuracy.

Next, in block 408, three simulation studies 410, 412 and 414 may be performed in consecutive stages to validate the data. First, in study 410, the water (brine) flood at constant flow rate is analyzed. Study 410, in particular, may ensure that data such as the fluid model (oil, water), the rock properties (porosity, permeability, relative permeability) and the simulation model itself are defined accurately. As noted above, in the example experiment, water or brine is injected into a core that is full of oil, and the constant flow rate flood reduces the oil saturation to a residual oil saturation as defined by relative permeability curves. Validation may occur by comparing the result of the water flood against calculated results based on Darcy's law.

Second, in study 412, the water (brine) flood an incremental flow rates is analyzed. A capillary desaturation model may be used to represent the further decrease of oil saturation beyond the residual oil saturation. This capillary desaturation model may include an interpolation between the relative permeability curves defined in the previous study, and hypothetical relative permeability curves corresponding to a state where the rock is fully stripped from the oil (i.e., where residual oil saturation is decreased to zero). During this study, the simulated interpolated relative permeability may be compared to the relative permeability derived from the experimental data using Darcy's law. This step may be used, for example, to validate the capillary desaturation model and the relative permeability curves that are used for simulation. It will be appreciated that studies 410-412 effectively establish a water base case, representing the amount of oil desaturation obtainable through water flooding alone, and against which the performance of the EOR chemical flood (e.g., in terms of additional observed reduction in residual oil saturation as a result of the EOR chemical flood) may be compared. In this regard, a water base case may be considered in some embodiments to be a base case established for the simulation model in which water, substantially free of other chemical additives, is injected into the core.

Third, in study 414, the polymer flood at incremental flow rates is analyzed. This study may use the capillary desaturation model and the validated relative permeability curves from the previous study. Polymer properties may be characterized and input to the simulation. Polymer properties may include, for example, solution viscosity as a function of the solution concentration, polymer solution shear rheology (relating the solution's shear viscosity with the water velocity), adsorption properties (e.g., tables of adsorbed polymer as a function of polymer concentration surrounding the rock, rock density, maximum adsorption concentration, and resulting maximum residual resistance factor, and whether the polymer can desorb from the rock), an inaccessible pore volume fraction (e.g., to estimate the proportion of pore volume that will not be penetrated by the polymer solution), etc. Additional properties, e.g., apparent viscosity (viscosity under shear stress when the polymer is injected in the rock) may not be known during a multi-phase flood and may be calculated.

It will be appreciated that polymer properties may more broadly be considered to be types of EOR chemical properties. Further, for EOR chemical floods using compositions other than aqueous polymer solutions, other types of properties relevant to the particular EOR chemicals utilized in such floods (e.g., adsorption rates, decay rates, chemical reaction rates, mobility reduction effects, interfacial tension, capillary pressure, temperature effects, shear rates, relative permeability hysteresis effects, etc.) may also be studied in a corresponding manner. As such, the invention is not limited to the particular study and analyzed properties disclosed herein in connection with a polymer coreflood with an aqueous polymer solution.

Upon completion of study 414, the workflow may return to block 406 to perform additional data review, e.g., to perform sensitivity analysis to investigate the impact of various uncertain simulation and/or physical parameters on the match between the simulation and experimental data. Thus, blocks 406 and 408 may be repeated multiple iterations in some instances (e.g., using history matching) to iteratively calibrate the reservoir simulation model and better match the experimental results. In addition, as illustrated by block 416, each stage or study 410-414 may also include iterative data review and corrections performed as desired to calibrate the reservoir simulation model.

In some embodiments of the invention, therefore, once a simulation model is designed to reproduce the experimental setup, an initial water or brine flood at a constant injection rate may be simulated and compared against experimental data to validate the simulation model. Then, the water or brine floods at incremental injection rates may be simulated and matched to the experimental data to validate the relative permeability curves and the modeling of the observed reduction in residual oil saturation. Thereafter, the EOR chemical floods may be simulated and matched to the experimental data to establish appropriate input parameters for the EOR chemical properties and to validate the models embedded in the reservoir simulator. Sensitivity analysis may thereafter be performed to investigate the impact of a number of uncertain simulation and physical parameters on the match between the simulation and the experimental data, and the simulation model may be revised accordingly.

In addition, it will be appreciated that validation of a model may be performed in various manners, as will be appreciated by those of ordinary skill in the art having the benefit of the instant disclosure. For example, in some embodiments, the reservoir simulator may produce output summary data including numerical values of pressure, flow rates, fluid saturations, etc. for each simulated time step, and this output data may be compared directly with the observed experimental results, or used to calculate derived quantities for comparison with the experimental results.

As also illustrated in block 418, once the simulation model is generated and validated in the manner described above, the simulation model may thereafter be used in connection with other coreflood and/or reservoir simulations. In addition, performing simulations with the simulation model either in connection with generating and validating the model or using the model for other simulations may result in the generation or modeling of various properties, including, for example, one or more of fluid flow, fluid distribution in a core, pressure drop across a core, or other properties that will be appreciated by those of ordinary skill in the art.

It will be appreciated that the manner in which workflow 400 may be implemented may vary in different embodiments. In some embodiments, for example, a graphical pre/post-processor, e.g., the PETREL graphical pre/post-processor, in communication with a general purpose reservoir simulator such as the ECLIPSE reservoir simulator, may be used in connection with the performance of a number of steps in the workflow, including, for example, generating the model, performing the aforementioned simulation studies on the simulation model, validating the simulation model, inputting data into the reservoir simulator, examining experimental data to check validity, visualizing simulation results (including visualizing results in one, two, three or more dimensions), and examining simulation results for comparison with the experimental data, among others. In addition, in some embodiments, some or all of the workflow may be implemented using a plug-in or script, e.g., to perform one or more of building a model, performing calculations to define input parameters, interpreting simulation results, comparing results with observed or experimental data, performing multiple realizations for sensitivity analysis, history matching, etc.

Thus, in some embodiments, a coreflood simulation model may be generated by generating a three-dimensional computer simulation model of a core plug used in a coreflood experiment in a computer-implemented general purpose reservoir simulator, performing one or more simulation studies on the simulation model to establish a water base case for the simulation model, and after performing the one or more simulation studies on the simulation model, performing an additional simulation study on the simulation model to establish one or more EOR chemical properties and to further validate the simulation model by simulating an EOR chemical flood at a plurality of incremental flow rates.

Further, in some embodiments, a coreflood may be simulated by loading a three dimensional computer simulation model of a core plug used in a coreflood experiment and validated by performing one or more simulation studies on the simulation model to establish a water base case for the simulation model and by performing an additional simulation study on the simulation model to establish one or more EOR chemical properties from simulation of an EOR chemical flood at a plurality of incremental flow rate, and running a simulation using the three-dimensional computer simulation model of the core plug in the computer-implemented general purpose reservoir simulator.

Modeling of Fluid Introduction Apparatus in Reservoir Simulation

As noted above, coreflood experiments may be performed by placing a core plug in a core holder. The core holder generally has fluid introduction and extraction elements referred to as platens that allow the fluids to circulate through the core, and that are designed to distribute the entry and exit of the fluids in the core across a relatively large area of the faces of the core.

It has been found that when the core length is small, it is desirable to identify the end effects that could be due to the geometry of the platens that lead to a homogenization of the flow further away in the core, or due to capillary effects. To do that, and as noted above, the geometry of the platens may be included in a three dimensional simulation model of the core plug to be more representative of the laboratory experiment.

Figure 6:
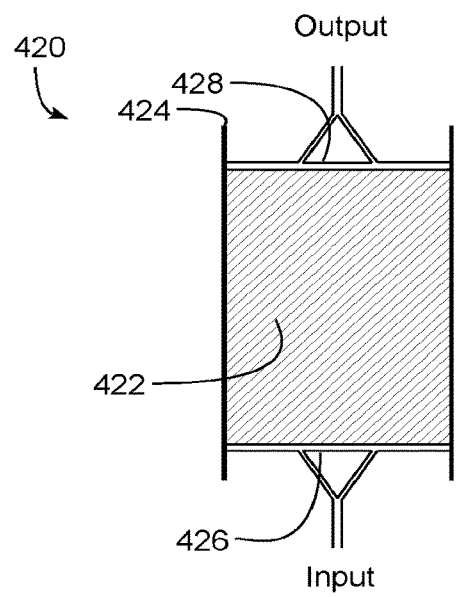
FIG. 6 is a functional diagram of an example core holder for a coreflood experiment.

FIG. 6, for example, illustrates an example core holder 420 for a coreflood experiment, where a core plug 422 is retained within a pressure confinement sleeve 424 with fluid introduction and extraction elements or platens 426, 428 disposed on the opposing faces of the core plug 422, with the introduction and extraction of fluids represented in the bottom and top of the figure.

Figure 7:
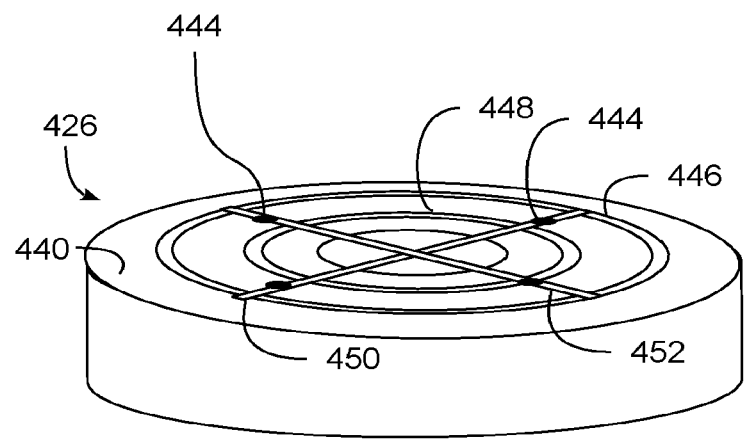
FIG. 7 is a perspective view of an example core holder platen.

Various platen designs may be used to distribute fluid across each face of the core plug 422. FIG. 7 illustrates one such platen design for fluid introduction element or platen 426, which may be used in some embodiments of the invention. In this design, a surface 440 that faces the core plug includes four symmetrically-disposed inlet ports 444 in fluid communication with a pair of concentric circular recessed channels 446, 448 through a pair of orthogonal radial recessed channels 450, 452. In some embodiments, an identical platen design to that illustrated in FIG. 7 may be used for a fluid extraction element or platen to extract fluid through four symmetrically-disposed outlet ports. It will be appreciated that an innumerable number of variations, including different numbers and/or layouts of ports, and different numbers, layouts and/or orientations of channels, may be used for the fluid introduction and fluid extraction elements in other embodiments, so the invention is not limited to the particular design illustrated herein.

Figure 8:
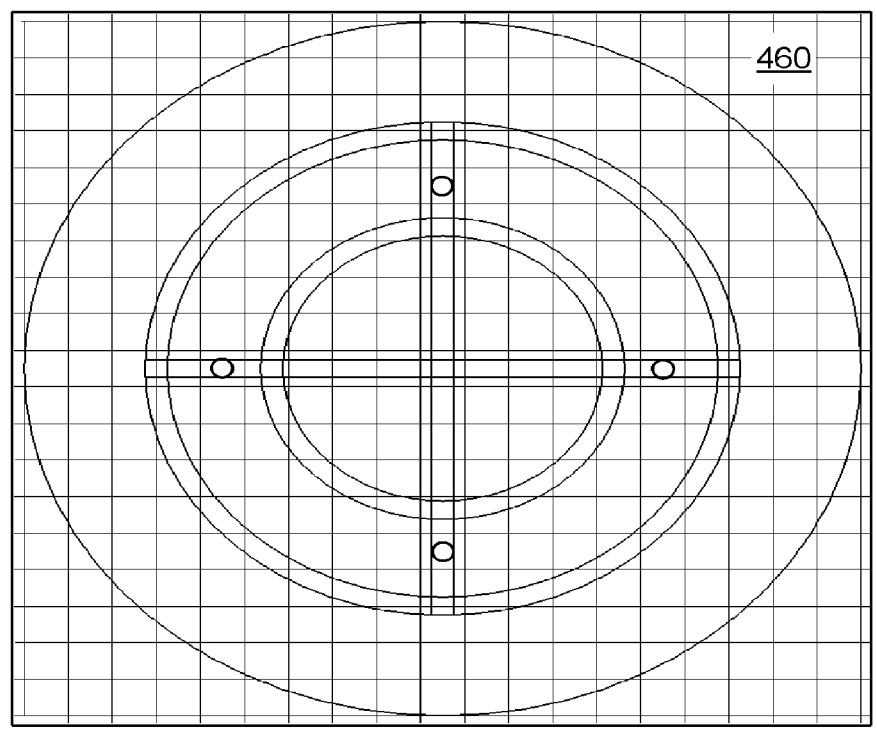
FIG. 8 is an engineering diagram of an example core holder platen geometry.

In some embodiments of the invention, it may be desirable to model the platens in three dimensions directly as part of a simulation grid. The dimensions of all of the flow conducting channels that have been designed to distribute the flow across the face of the core may be determined in order to incorporate the design within the simulation grid, and in some embodiments, detailed engineering diagrams, e.g., as shown at 460 in FIG. 8, may be used to integrate the platen design, and in particular, the channels defined by the platen, into the simulation grid. In some embodiments, software such as available in the PETREL software platform may be used in this process.

Figure 9:
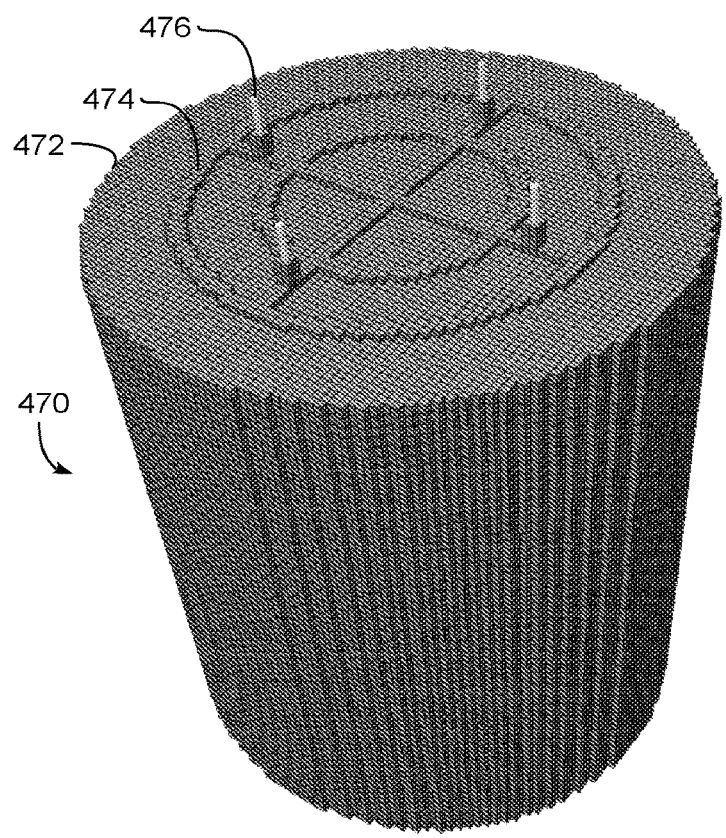
FIG. 9 illustrates an example three dimensional simulation model of a core plug, and including platens in accordance with implementations of various technologies and techniques described herein.
Figure 10:
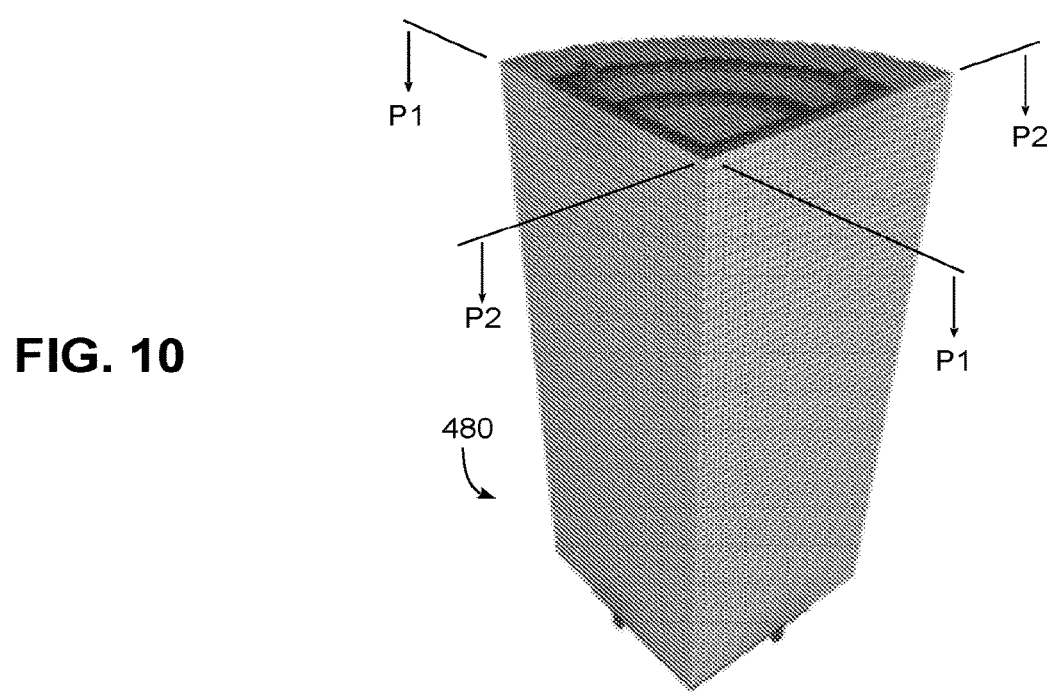
FIG. 10 illustrates end effects of platens in an example reservoir simulation performed with the simulation model of FIG. 10.

The resulting framework may then be used to construct a full three dimensional model that captures the overall design of the core plug and the platens, e.g., as illustrated at 470 in FIG. 9, where the top of the figure represents the outlet platen, with the inlet platen also included in the model but not shown by virtue of the orientation of the figure. An end surface 472 represents the mating surface between the outlet platen and the end of the core, with channels modeled as illustrated at 474 and outlet ports modeled as illustrated at 476. The impact of modeling such an apparatus is observed by visualizing the distribution of fluids either when running the simulation or when the simulation has completed. FIG. 10, for example, is a cross-sectional view of the model, and it can be seen by the difference in shading proximate the platens the heterogeneous distribution of fluid flow proximate the faces of the core plug, and thus the end effects experienced during a coreflood experiment. As such, model 470 may be used in some embodiments to model the distribution and fingering of fluid flow proximate one or more faces of a core plug.

Returning to FIG. 9, it may be desirable in some embodiments to set the platen channels 474 in the model to have a porosity of 1 (assuming the channels do not include a porous material) and a high permeability to accurately represent the flow characteristics of the platen channels relative to the core plug. Boundary conditions for the resulting model may be modeled by injection wells (for the inlet platen) and production wells (for the outlet platen) perforated at injection points in the platen that were used in the experiment to represent the piping connected to the core holder system (e.g., as illustrated at 476 for the outlet platen). Injection wells may be assigned to the same group and controlled by a group injection rate since the flow rate controlled by the pump is that of the main pipe that splits into the various injection points. This group injection rate may therefore be set as the pump rate. The production wells may be controlled by a bottom hole pressure limit set to 1 atm, since the outlet piping connects to atmospheric pressure.

In some embodiments, if the injection and/or production systems are symmetric about one or more planes along an axis of symmetry of the core plug, and the core plug may be treated as homogeneous, an even distribution of flow in each inlet/outlet port may be assumed, and the model may be simplified to a segment representing only a portion of the full model, e.g., as shown by quarter cylinder segment 480 in FIG. 10 (segmented along two orthogonal planes P1 and P2 about the core's axis of symmetry), which may result in faster simulations (due to the reduced number of cells) with comparable accuracy. In other embodiments, symmetry may exist in fewer or greater numbers of planes. In one other embodiment, for example, the injection and production systems may be symmetric about a single plane, such that a semi cylinder segment may be used.

The size or resolution of the simulation grid used for a model may vary in different embodiments. For example, in some embodiments, it may be desirable to use a resolution that substantially matches that of a nuclear magnetic resonance scanner used to determine oil saturation in the core during a coreflood experiment. Other resolutions, however, may be used in other embodiments.

It will be appreciated that by modeling the fluid introduction and extraction elements or platens, end effects may be simulated to provide a more accurate simulation. In some embodiments, this may allow shorter and/or narrower core plugs to be used in experiments. Further, in some embodiments, the herein-described techniques may be used in the design of fluid introduction and extraction elements or platens, e.g., to confirm whether a particular design provides a desired fluid flow for a particular application.

Thus, in some embodiments, a coreflood experiment may be modeled by generating a three dimensional computer simulation model of a core plug used in a coreflood experiment, and modeling in the three dimensional computer simulation model of the core plug one or both of a fluid introduction element or a fluid extraction element of a core holder used in the coreflood experiment. Further, in some embodiments, fluid flow through a core plug in a coreflood experiment may be modeled by loading a three dimensional computer simulation model of a core plug that additionally models one or both of a fluid introduction element or a fluid extraction element of a core holder, and running a simulation using the three dimensional computer simulation model in a computer-implemented reservoir simulator to model heterogeneous distribution of fluid flow proximate one or more faces of the core plug.

Multi-Phase Polymer Shear Viscosity Calculation

In some embodiments, simulation accuracy, particularly for the simulation of aqueous polymer composition injection, may be further improved by estimating one or more properties of the aqueous polymer composition (e.g., apparent viscosity, i.e., viscosity under shear stress when injected in the core) during a multi-phase coreflood.

It has been found, for example, that the apparent viscosity of an aqueous polymer composition may be straightforwardly calculated during a single-phase flood using Darcy's law. However, for a multi-phase flood, Darcy's law includes an additional term in the equation for each phase: the relative permeability of that phase. For example the water flow depends on the water relative permeability. When the residual oil saturation is decreased beyond its initial value (capillary desaturation), there is a change of the water relative permeability that may be difficult to characterize through measurements, thereby complicating the calculation of apparent viscosity.

In some embodiments of the invention, apparent viscosity of an aqueous polymer composition, e.g., including one or more viscoelastic polymers, during a multi-phase coreflood experiment may be calculated using a workflow that in part utilizes data from the aforementioned water or brine floods performed with stepwise incremented flow rates. These types of floods may be used to verify that the relative permeability interpolation model associated with capillary desaturation are appropriate. Then, these relative permeability curves may be used to calculate the relative permeability of an aqueous polymer composition during the multi-phase flood, based on the state of oil saturation in the core. The relative permeability points may then be used to calculate the apparent viscosity of the aqueous polymer composition using Darcy's law, and the resulting calculation may then be validated by matching the simulation model to the coreflood experimental results.

Figure 11:
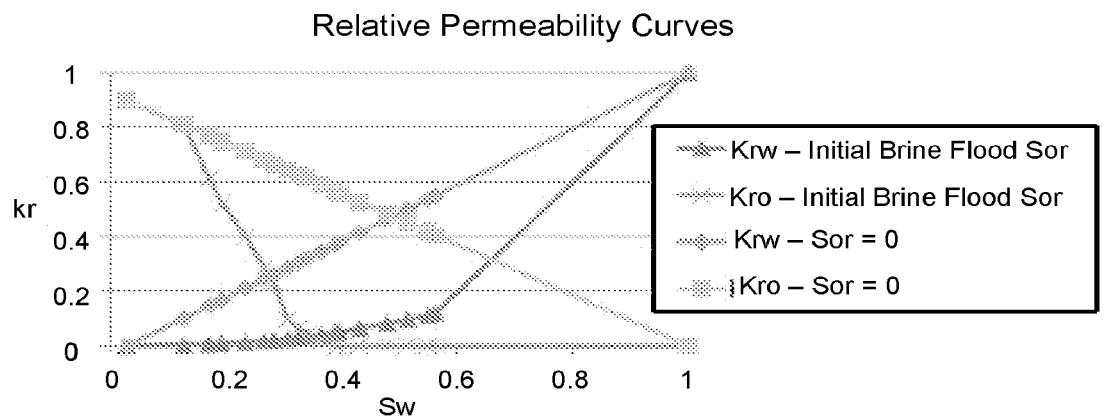
FIG. 11 is an example graph of a relative permeability model.

A capillary desaturation function may be used to account for the reduction in residual oil saturation occurring during a multi-phase flood of aqueous polymer composition into oil with increasing injection flow rate. The model may interpolate relative permeability curves between relative permeability curves associated with the residual oil saturation of the initial brine flood, and curves assuming that the residual oil saturation is taken down to 0, e.g., as shown in FIG. 11. A water or brine flood experiment at varying flow rates may be performed and matched in order to validate the relative permeability curves interpolation. The water relative permeability obtained in the simulation may also be compared with the curve derived from the laboratory measurements.

To calculate the relative permeability to water, Darcy's law may be applied:

$$k_{rw} = \frac{Q\mu L}{kA\Delta P} \quad \text{(Eq. 1)}$$

where $k_{rw}$ is the relative permeability to water, Q is the injection flow rate in m$^3$/s, μ is the viscosity in Pa·s, L is the length of the core, k is the absolute permeability of the rock, A is the cross sectional area of the core and ΔP is the pressure drop across the core in Pa.

The interpolated curve from the simulation may be obtained by outputting block summary vectors for water saturation and $k_{rw}$, and once the water relative permeability curve used for the simulation is validated against the experimental data, the apparent viscosity may be calculated based on Darcy's law.

Figure 12:
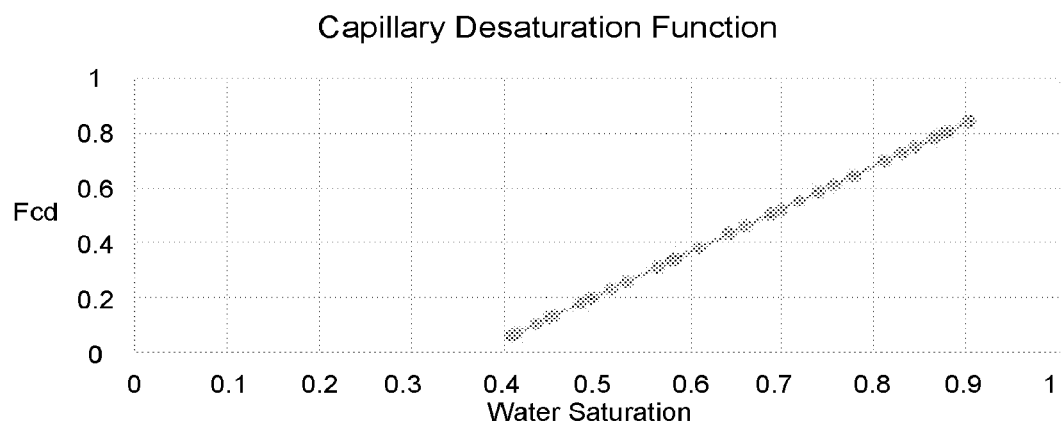
FIG. 12 is an example graph of a capillary desaturation function.

The calculation of the interpolated $k_{rw}$ may be based on the relative permeability curves mentioned previously and on the capillary desaturation function. The capillary desaturation function (an example of which is illustrated in FIG. 12) may be defined as follows (where $S_{or}$ is residual oil saturation):

$$F_{cd} = 1 - \frac{S_{or}(@ \text{end of flow period})}{S_{or}(@ \text{end of initial brine flood})} \quad \text{(Eq. 2)}$$

Figure 13:
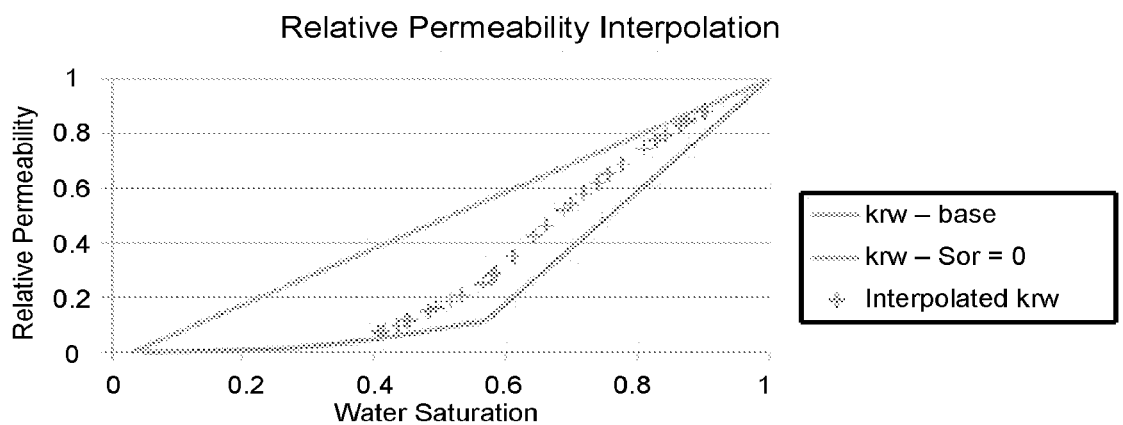
FIG. 13 is an example graph of a relative permeability interpretation model.

From there, the relative permeability may be calculated at the end of each flow period from:

$$k_{rw_{interpolated}} = F_{cd} k_{rw_{straightline}} (1-F_{cd}) * k_{rw_{initial}} \quad \text{(Eq. 3)}$$

and plotted against Sw=1−$S_{or}$(@end of flow period), an example of which is illustrated in FIG. 13.

Figure 14:
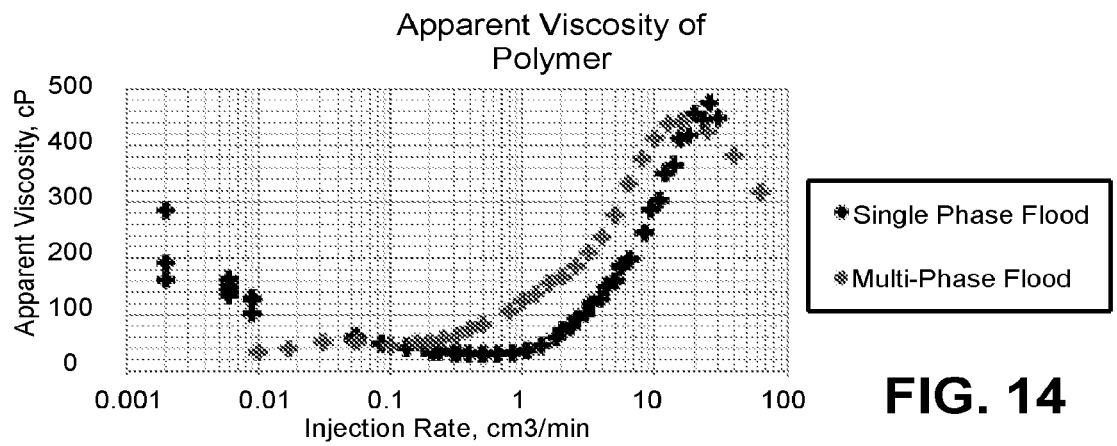
FIG. 14 is an example graph of a comparison of apparent viscosity derived from single-phase corefloods and multi-phase corefloods.

Next, the apparent viscosity may be calculated from Darcy's law:

$$\mu = \frac{kk_{rw_{interpolated}} A \Delta P}{QL} \quad \text{(Eq. 4)}$$

where k is the absolute permeability of the rock in m$^2$, $k_{rw_{interpolated}}$ is the calculated interpolated relative permeability in fraction, A is the cross sectional area of the core in m$^2$, ΔP is the pressure drop across the core in Pa, Q is the injection flow rate in m$^3$/s and L is the length of the core in m. FIG. 14, for example, compares apparent viscosity calculations derived from multi-phase corefloods with those derived from single-phase corefloods.

Figure 15:
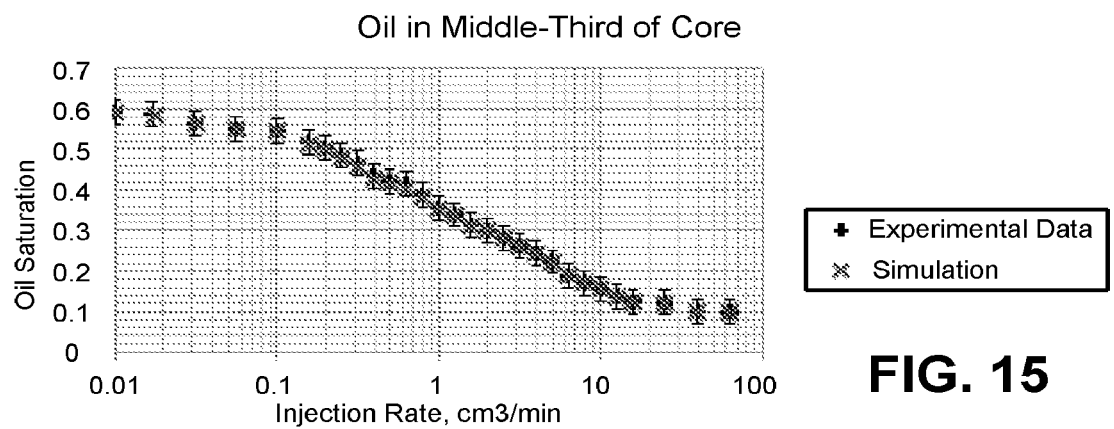
FIG. 15 is an example graph of a comparison of simulation results against experimental data for an example oil saturation.
Figure 16:
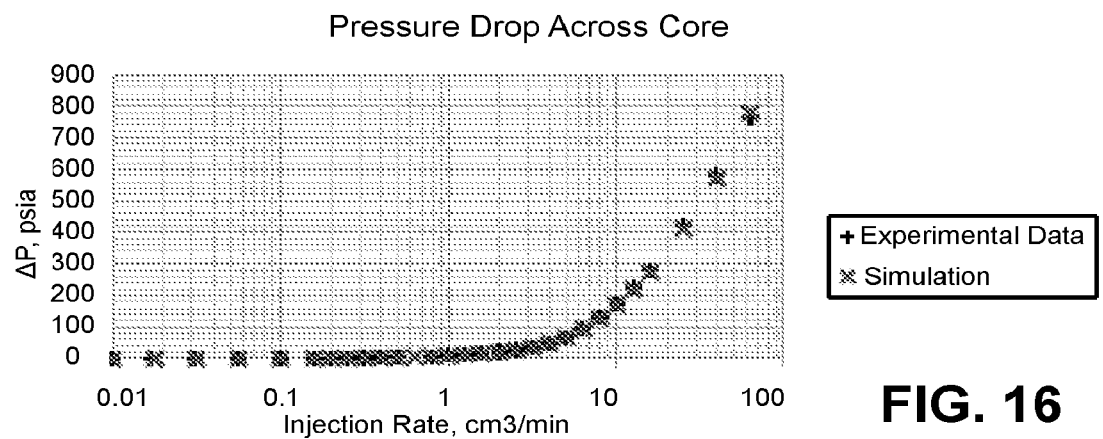
FIG. 16 is an example graph of a comparison of simulation results against experimental data for the pressure drop across an example core.

The aforementioned calculations may be validated by running a simulation of the EOR chemical coreflood experiment. As illustrated by FIGS. 15 and 16, an excellent match for oil saturation in a core and pressure drop across the core has been observed in one example embodiment.

Figure 17:
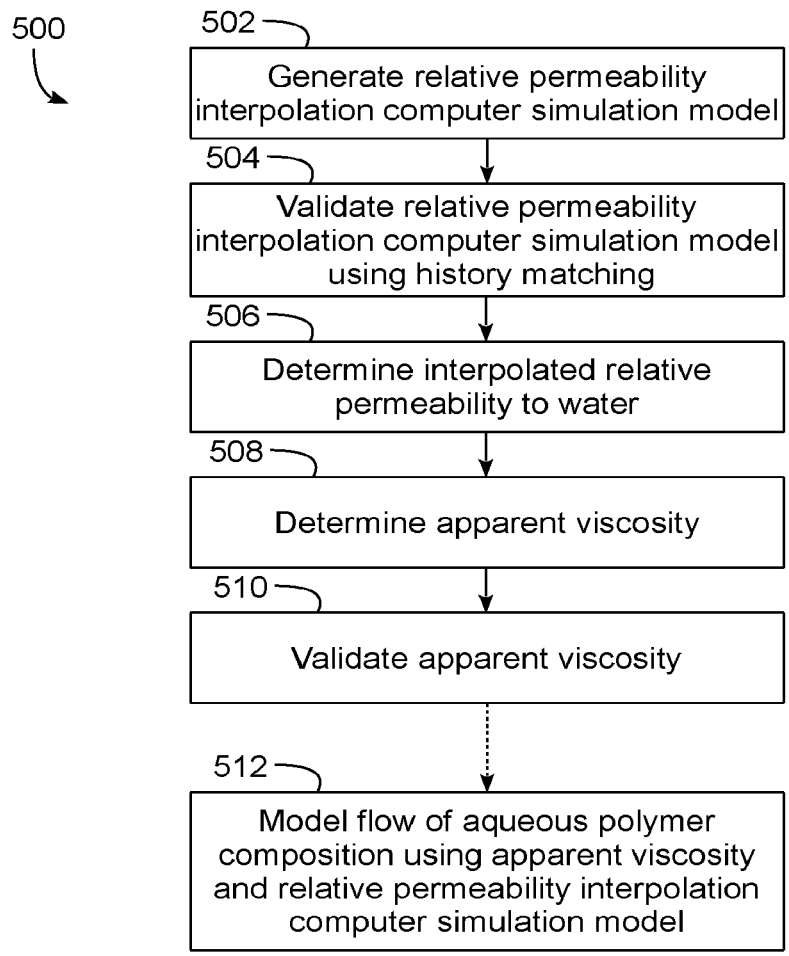
FIG. 17 illustrates an example sequence of operations for determining an apparent viscosity for an aqueous polymer composition and modeling a flow of the aqueous polymer composition using the determined apparent viscosity in accordance with implementations of various technologies and techniques described herein.

FIG. 17, for example, illustrates an example sequence of operations 500 for both determining an apparent viscosity for an aqueous polymer composition used in a polymer flood and modeling a flow of the aqueous polymer composition using the determined apparent viscosity consistent with some embodiments of the invention. As shown in block 502, sequence of operations 500 begins by generating a relative permeability interpolation computer simulation model that is associated with a capillary desaturation function and that interpolates relative permeability curves for a coreflood experiment. Next, in block 504, the relative permeability interpolation computer simulation model is validated, e.g., using experimental data generated from a coreflood experiment using a water flood performed at a plurality of incremental flow rates on a core plug, in the manner described above. In some embodiments, the validation of the model may include performing history matching, and in some embodiments, the validation may include running a computer simulation using the model in a reservoir simulator.

Next, in block 506, an interpolated relative permeability to water for the aqueous polymer composition using experimental data generated from the coreflood experiment using a multi-phase flood with the aqueous polymer composition, again in the manner described above. Then, in block 508, the apparent viscosity of the aqueous polymer composition may be determined from the interpolated relative permeability to water in the manner described above. In some embodiments, as illustrated in block 510, the determined apparent viscosity may also be validated, e.g., using experimental data from the coreflood experiment.

It will be appreciated that the apparent viscosity of the aqueous polymer composition will generally depend on the flow conditions, e.g., the apparent shear rate, in the coreflood experiment. As such, in some embodiments, shear rate or another parameter related to flow conditions (e.g., flow velocity) may be calculated at different flow rates and the result of the calculations may be used to determine apparent viscosity based on a table, graph or other data structure or representation that maps different values of apparent viscosity against apparent shear rate, flow velocity or another parameter related to flow conditions. In some embodiments, for example, the apparent viscosity may be plotted against an apparent shear rate $\dot{\gamma}$ calculated as follows:

$$\dot{\gamma} = \frac{Q}{A(Sw - Swcr)\sqrt{k\varphi}} \quad \text{(Eq. 5)}$$

where Q is the injection flow rate in m$^3$/s, A is the cross sectional area of the core in m$^2$, $(S_w - S_{wcr})$ is the mobile water saturation, k is the absolute permeability of the rock in m$^2$ and $\varphi$ is the porosity.

Next, as illustrated in block 512, the determined apparent viscosity, along with the relative permeability interpolation computer simulation model (as well as the capillary desaturation function embedded therein) may be used to model flow of the aqueous polymer composition, e.g., by running a simulation in a reservoir simulator. The simulation may be another coreflood simulation for the purpose of modeling flow through a core, or may be a reservoir simulation for more modeling flow through a reservoir, e.g., to simulate injection of the aqueous polymer composition into a reservoir. It will be appreciated, however, that the determined apparent viscosity may be used in a number of other applications, e.g., to predict the injectivity of the injection wells, to determine the optimum injection rates and pressures for polymer injection operations, etc.

Although the preceding description has been described herein with reference to particular means, materials, and embodiments, it is not intended to be limited to the particular disclosed herein. By way of further example, embodiments may be utilized in conjunction with a handheld system (i.e., a phone, wrist or forearm mounted computer, tablet, or other handheld device), portable system (i.e., a laptop or portable computing system), a fixed computing system (i.e., a desktop, server, cluster, or high performance computing system), or across a network (i.e., a cloud-based system). As such, embodiments extend to all functionally equivalent structures, methods, uses, program products, and compositions as are within the scope of the appended claims.

While particular embodiments have been described, it is not intended that the invention be limited thereto, as it is intended that the invention be as broad in scope as the art will allow and that the specification be read likewise. It will therefore be appreciated by those skilled in the art that yet other modifications could be made without deviating from its spirit and scope as claimed.

What is claimed is:

1. A method of modeling fluid flow through a core plug in a coreflood experiment, the method comprising:
    loading a three dimensional computer simulation model of a core plug that additionally models one or both of a fluid introduction element or a fluid extraction element of a core holder, wherein the three dimensional computer simulation model models the one or both of the fluid introduction element or the fluid extraction element of the core holder using a plurality of grid cells, and wherein the plurality of grid cells model at least one channel or port through which fluid flows in the one or both of the fluid introduction element or the fluid extraction element; and
    running a simulation using the three dimensional computer simulation model in a computer-implemented reservoir simulator to model heterogeneous distribution of fluid flow proximate one or more faces of the core plug,
    wherein the one or both of the fluid introduction element or the fluid extraction element are symmetrical about one or more planes along an axis of symmetry of the core plug and the three dimensional computer simulation model and the three dimensional computer simulation model and the one or both of the fluid introduction element or the fluid extraction element includes only a segment of the one or both of the fluid introduction element or the fluid extraction element.

2. The method of claim 1, wherein the computer-implemented reservoir simulator comprises a general purpose reservoir simulator.

3. The method of claim 1, wherein the one or both of the fluid introduction element or the fluid extraction element modeled in the three dimensional computer simulation model an end effect in the coreflood experiment, and wherein running the simulation includes modeling boundary conditions by representing the fluid introduction element as an injection well and representing the fluid extraction element as a production well.

4. The method of claim 1, wherein the core plug is homogeneous such that the three dimensional computer simulation model has a second plurality of grid cells having a same property and representing the core plug.

5. The method of claim 1, wherein the core plug is heterogeneous such that the three dimensional computer simulation model has a second plurality of grid cells with varying properties and representing the core plug.

6. The method of claim 1, wherein running the simulation using the three dimensional computer simulation includes modeling distribution and fingering of fluid flow proximate one or more faces of the core plug.

7. The method of claim 6, wherein running the simulation includes modeling pressure drop across the core plug.

8. The method of claim 1, further comprising:
    generating the three dimensional computer simulation model using a graphical pre/post-processor for a general purpose reservoir simulation; and
    displaying simulation results in three dimensions using the graphical pre/post-processor.

9. The method of claim 1, wherein the plurality of grid cells of the three dimensional computer simulation model models the fluid introduction element and the fluid extraction element.

10. The method of claim 1, wherein the plurality of grid cells of the three dimensional computer simulation model a plurality of ports in each of the fluid introduction element and the fluid extraction element.

11. The method of claim 10, wherein the plurality of grid cells of the three dimensional computer simulation model a plurality of channels in each of the fluid introduction element and the fluid extraction element.

12. The method of claim 11, wherein the plurality of grid cells of the three dimensional computer simulation model a plurality of circular channels.

13. The method of claim 11, wherein the plurality of grid cells of the three dimensional computer simulation model a plurality of radial channels.

14. The method of claim 1, wherein the three dimensional computer simulation model has a grid with a resolution that substantially matches that of a nuclear magnetic resonance scanner used to determine oil saturation in the core during the coreflood experiment.

15. The method of claim 1, wherein the one or both of the fluid introduction element or the fluid extraction element are symmetrical about one or more planes along an axis of symmetry of the core plug, and wherein the three dimensional computer simulation model models only a segment of the core plug and the one or both of the fluid introduction element or the fluid extraction element.

16. The method of claim 15, wherein the fluid introduction element and the fluid extraction element are each symmetrical about a single plane, and wherein generating the three dimensional computer simulation model and wherein the three dimensional computer simulation model models only a semi cylinder segment of the core plug and the one or both of the fluid introduction element or the fluid extraction element.

17. The method of claim 15, wherein the fluid introduction element and the fluid extraction element are each symmetrical about a first and second orthogonal planes, and wherein the three dimensional computer simulation model models only a quarter cylinder segment of the core plug and the one or both of the fluid introduction element or the fluid extraction element.

18. An apparatus, comprising:
a memory, the memory storing a three dimensional computer simulation model of a core plug that additionally models one or both of a fluid introduction element or a fluid extraction element of a core holder, wherein the three dimensional computer simulation model models the one or both of the fluid introduction element or the fluid extraction element of the core holder using a plurality of grid cells, and wherein the plurality of grid cells model at least one channel or port through which fluid flows in the one or both of the fluid introduction element or the fluid extraction element;
at least one processing unit; and
program code configured upon execution by the at least one processing unit to run a simulation using the three dimensional computer simulation model in a computer-implemented reservoir simulator to model heterogeneous distribution of fluid flow proximate one or more faces of the core plug,
wherein the one or both of the fluid introduction element or the fluid extraction element are symmetrical about one or more planes along an axis of symmetry of the core plug and the three dimensional computer simulation model and the three dimensional computer simulation model and the one or both of the fluid introduction element or the fluid extraction element includes only a segment of the one or both of the fluid introduction element or the fluid extraction element.

19. The apparatus of claim 18, further comprising program code configured upon execution by the at least one processing unit to generate the three dimensional computer simulation model and to model in the three dimensional computer simulation model the one or both of the fluid introduction element or the fluid extraction element of the core holder.

20. A program product, comprising:
a non-transitory computer readable medium; and
program code stored on the computer readable medium and configured upon execution by at least one processing unit to model fluid flow through a core plug in a coreflood experiment by:
loading a three dimensional computer simulation model of a core plug that additionally models one or both of a fluid introduction element or a fluid extraction element of a core holder, wherein the three dimensional computer simulation model models the one or both of the fluid introduction element or the fluid extraction element of the core holder using a plurality of grid cells, and wherein the plurality of grid cells model at least one channel or port through which fluid flows in the one or both of the fluid introduction element or the fluid extraction element; and
running a simulation using the three dimensional computer simulation model in a computer-implemented reservoir simulator to model heterogeneous distribution of fluid flow proximate one or more faces of the core plug,
wherein the one or both of the fluid introduction element or the fluid extraction element are symmetrical about one or more planes along an axis of symmetry of the core plug and the three dimensional computer simulation model and the three dimensional computer simulation model and the one or both of the fluid introduction element or the fluid extraction element includes only a segment of the one or both of the fluid introduction element or the fluid extraction element.

* * * * *